(12) United States Patent
Black et al.

(10) Patent No.: US 9,491,007 B2
(45) Date of Patent: Nov. 8, 2016

(54) APPARATUS AND METHOD FOR ANTENNA MATCHING

(71) Applicant: GOOGLE TECHNOLOGY HOLDINGS LLC, Mountain View, CA (US)

(72) Inventors: Gregory R. Black, Vernon Hills, IL (US); Vijay L. Asrani, Round Lake, IL (US); Young Hun Kim, Buffalo Grove, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 0 days.

(21) Appl. No.: 14/280,775

(22) Filed: May 19, 2014

(65) Prior Publication Data

US 2015/0312058 A1 Oct. 29, 2015

Related U.S. Application Data

(60) Provisional application No. 61/984,927, filed on Apr. 28, 2014.

(51) Int. Cl.
*H04L 25/02* (2006.01)
*H04B 1/18* (2006.01)
(Continued)

(52) U.S. Cl.
CPC .......... *H04L 25/0278* (2013.01); *H01Q 1/242* (2013.01); *H01Q 1/50* (2013.01);
(Continued)

(58) Field of Classification Search
CPC ........ H01Q 1/243; H01Q 1/242; H01Q 1/50; H01Q 1/52; H01Q 21/28; H03H 11/30; H03H 7/40; H04B 17/103; H04B 1/0458; H04B 1/3833; H04B 1/18; H04B 3/03; H04L 25/0278; H04M 1/0274; H04M 2250/12
See application file for complete search history.

(56) References Cited

U.S. PATENT DOCUMENTS 4,612,669 A 9/1986 Nossen
4,631,543 A 12/1986 Brodeur
(Continued)

FOREIGN PATENT DOCUMENTS

CN 1762137 4/2006
CN 1859656 11/2006
(Continued)

OTHER PUBLICATIONS

European Patent Office, International Search Report and the Written Opinion of the International Patent Application PCT/US2015/027872 (Jul. 15, 2015).
(Continued)

*Primary Examiner* — Lewis West
(74) *Attorney, Agent, or Firm* — Wolfe-SBMC

(57) ABSTRACT

A method and apparatus are for performing antenna matching and include determining a cable connection state of a cable connector, generating a cable detection signal that indicates the cable connection state, and modifying impedance transform of a tunable matching circuit in response to the cable detection signal. The cable detection signal indicates one of a presence and an absence of a cable connector. The tunable matching circuit couples a transceiver and an antenna. The tunable matching circuit couples the selected impedance transform between the transceiver and the antenna. The apparatus is a radio communication device that includes a transceiver, a processing system, an antenna, a tunable matching circuit, an input/output section, a cable connector, and a sensor.

20 Claims, 7 Drawing Sheets

(51) Int. Cl.
  *H04B 1/04* (2006.01)
  *H01Q 21/28* (2006.01)
  *H01Q 1/52* (2006.01)
  *H01Q 1/24* (2006.01)
  *H01Q 1/20* (2006.01)
  *H04B 3/03* (2006.01)
  *H03H 7/40* (2006.01)
  *H04M 1/02* (2006.01)
  *H01Q 1/50* (2006.01)

(52) U.S. Cl.
  CPC .............. *H01Q 1/52* (2013.01); *H01Q 21/28* (2013.01); *H03H 7/40* (2013.01); *H04B 1/0458* (2013.01); *H04B 1/18* (2013.01); *H04B 3/03* (2013.01); *H04M 1/0274* (2013.01); *H04M 2250/12* (2013.01)

(56) References Cited

U.S. PATENT DOCUMENTS

| | | |
|---|---|---|
| 4,754,285 A | 6/1988 | Robitaille |
| 4,881,123 A | 11/1989 | Chapple |
| 4,884,252 A | 11/1989 | Teodoridis et al. |
| 5,267,234 A | 11/1993 | Harrison |
| 5,459,440 A * | 10/1995 | Claridge et al. ............ 333/17.3 |
| 5,564,086 A | 10/1996 | Cygan et al. |
| 5,634,200 A | 5/1997 | Kitakubo et al. |
| 5,649,307 A | 7/1997 | Patino |
| 5,699,319 A | 12/1997 | Skrivervik |
| 5,757,326 A | 5/1998 | Koyama et al. |
| 5,804,944 A | 9/1998 | Alberkrack et al. |
| 5,862,458 A | 1/1999 | Ishii |
| 6,144,186 A | 11/2000 | Thandiwe et al. |
| 6,339,758 B1 | 1/2002 | Kanazawa et al. |
| 6,362,690 B1 | 3/2002 | Tichauer |
| 6,373,439 B1 | 4/2002 | Zurcher et al. |
| 6,400,702 B1 | 6/2002 | Meier |
| 6,560,444 B1 | 5/2003 | Imberg |
| 6,594,508 B1 | 7/2003 | Ketonen |
| 6,674,291 B1 | 1/2004 | Barber et al. |
| 6,879,942 B1 | 4/2005 | Nagase et al. |
| 6,927,555 B2 | 8/2005 | Johnson |
| 6,937,980 B2 | 8/2005 | Krasny et al. |
| 7,019,702 B2 | 3/2006 | Henriet et al. |
| 7,142,884 B2 | 11/2006 | Hagn |
| 7,199,754 B2 | 4/2007 | Krumm et al. |
| 7,202,734 B1 | 4/2007 | Raab |
| 7,202,815 B2 | 4/2007 | Swope et al. |
| 7,224,992 B2 | 5/2007 | Patino et al. |
| 7,254,420 B1 | 8/2007 | Klein |
| 7,260,366 B2 | 8/2007 | Lee et al. |
| 7,359,504 B1 | 4/2008 | Reuss et al. |
| 7,400,907 B2 | 7/2008 | Jin et al. |
| 7,433,661 B2 | 10/2008 | Kogiantis et al. |
| 7,436,896 B2 | 10/2008 | Hottinen et al. |
| 7,440,731 B2 | 10/2008 | Staudinger et al. |
| 7,471,963 B2 | 12/2008 | Kim et al. |
| 7,486,931 B2 | 2/2009 | Cho et al. |
| 7,504,833 B1 | 3/2009 | Sequine |
| 7,599,420 B2 | 10/2009 | Forenza et al. |
| 7,620,432 B2 | 11/2009 | Willins et al. |
| D606,958 S | 12/2009 | Knoppert et al. |
| 7,639,660 B2 | 12/2009 | Kim et al. |
| 7,643,642 B2 | 1/2010 | Patino et al. |
| 7,649,831 B2 | 1/2010 | Van Rensburg et al. |
| 7,664,200 B2 | 2/2010 | Ariyavisitakul et al. |
| 7,746,943 B2 | 6/2010 | Yamaura |
| 7,760,681 B1 | 7/2010 | Chhabra |
| 7,773,535 B2 | 8/2010 | Vook et al. |
| 7,773,685 B2 | 8/2010 | Tirkkonen et al. |
| 7,813,696 B2 | 10/2010 | Kim |
| 7,822,140 B2 | 10/2010 | Catreux et al. |
| 7,835,711 B2 | 11/2010 | McFarland |
| 7,839,201 B2 | 11/2010 | Jacobson |
| 7,864,969 B1 | 1/2011 | Ma et al. |
| 7,885,211 B2 | 2/2011 | Shen et al. |
| 7,936,237 B2 | 5/2011 | Park et al. |
| 7,940,740 B2 | 5/2011 | Krishnamurthy et al. |
| 7,942,936 B2 | 5/2011 | Golden |
| 7,945,229 B2 | 5/2011 | Wilson et al. |
| 7,983,722 B2 | 7/2011 | Lowles et al. |
| 8,014,455 B2 | 9/2011 | Kim et al. |
| 8,072,285 B2 | 12/2011 | Spears et al. |
| 8,094,011 B2 | 1/2012 | Faris et al. |
| 8,095,081 B2 | 1/2012 | Vance |
| 8,098,120 B2 | 1/2012 | Steeneken et al. |
| 8,155,683 B2 | 4/2012 | Buckley et al. |
| 8,204,446 B2 | 6/2012 | Scheer et al. |
| 8,219,336 B2 | 7/2012 | Hoebel et al. |
| 8,219,337 B2 | 7/2012 | Hoebel et al. |
| 8,232,685 B2 | 7/2012 | Perper et al. |
| 8,233,851 B2 | 7/2012 | Jeon et al. |
| 8,244,317 B2 | 8/2012 | Knoppert et al. |
| 8,259,431 B2 | 9/2012 | Katta |
| 8,275,327 B2 | 9/2012 | Yi et al. |
| 8,280,038 B2 | 10/2012 | Johnson et al. |
| 8,280,323 B2 | 10/2012 | Thompson |
| 8,284,849 B2 | 10/2012 | Lee et al. |
| 8,302,183 B2 | 10/2012 | Sood |
| 8,319,393 B2 | 11/2012 | DeReus |
| 8,373,596 B1 | 2/2013 | Kimball et al. |
| 8,374,633 B2 | 2/2013 | Frank et al. |
| 8,384,695 B2 | 2/2013 | Lee et al. |
| 8,428,022 B2 | 4/2013 | Frank et al. |
| 8,460,961 B2 | 6/2013 | Guo et al. |
| 8,483,707 B2 | 7/2013 | Krishnamurthy et al. |
| 8,509,338 B2 | 8/2013 | Sayana et al. |
| 8,542,776 B2 | 9/2013 | Kim et al. |
| 8,588,426 B2 | 11/2013 | Xin et al. |
| 8,594,584 B2 | 11/2013 | Greene et al. |
| 8,606,200 B2 | 12/2013 | Ripley et al. |
| 8,611,829 B2 | 12/2013 | Alberth et al. |
| 8,620,348 B2 | 12/2013 | Shrivastava et al. |
| 8,626,083 B2 | 1/2014 | Greene et al. |
| 8,712,340 B2 | 4/2014 | Hoirup et al. |
| 8,712,355 B2 | 4/2014 | Black et al. |
| 8,731,496 B2 | 5/2014 | Drogi et al. |
| 8,761,296 B2 | 6/2014 | Zhang et al. |
| 8,767,722 B2 | 7/2014 | Kamble et al. |
| 8,909,173 B2 | 12/2014 | Harmke |
| 8,989,747 B2 | 3/2015 | Padden et al. |
| 9,002,354 B2 | 4/2015 | Krishnamurthy et al. |
| 9,031,523 B2 | 5/2015 | Anderson |
| 9,197,255 B2 | 11/2015 | Pourkhaatoun et al. |
| 9,203,489 B2 | 12/2015 | Sayana et al. |
| 9,215,659 B2 | 12/2015 | Asrani et al. |
| 9,241,050 B1 | 1/2016 | Asrani et al. |
| 9,298,303 B2 | 3/2016 | Wagner et al. |
| 9,301,177 B2 | 3/2016 | Ballantyne et al. |
| 9,344,837 B2 | 5/2016 | Russel et al. |
| 9,386,542 B2 | 7/2016 | Russell et al. |
| 9,401,750 B2 | 7/2016 | Sayana et al. |
| 9,413,409 B2 | 8/2016 | Black et al. |
| 2001/0034238 A1 | 10/2001 | Voyer |
| 2002/0037742 A1 | 3/2002 | Enderlein et al. |
| 2002/0057751 A1 | 5/2002 | Jagger et al. |
| 2002/0090974 A1 | 7/2002 | Hagn |
| 2002/0138254 A1 | 9/2002 | Isaka et al. |
| 2002/0149351 A1 | 10/2002 | Kanekawa et al. |
| 2002/0193130 A1 | 12/2002 | Yang et al. |
| 2003/0143961 A1 | 7/2003 | Humphreys et al. |
| 2003/0161485 A1 | 8/2003 | Smith |
| 2003/0222819 A1 | 12/2003 | Karr et al. |
| 2004/0051583 A1 | 3/2004 | Hellberg |
| 2004/0052314 A1 | 3/2004 | Copeland |
| 2004/0052317 A1 | 3/2004 | Copeland |
| 2004/0057530 A1 | 3/2004 | Tarokh et al. |
| 2004/0063439 A1 | 4/2004 | Glazko et al. |
| 2004/0082356 A1 | 4/2004 | Walton et al. |
| 2004/0106428 A1* | 6/2004 | Shoji ............... 455/550.1 |
| 2004/0148333 A1 | 7/2004 | Manion et al. |
| 2004/0176125 A1 | 9/2004 | Lee |
| 2004/0178912 A1 | 9/2004 | Smith et al. |

(56) References Cited

U.S. PATENT DOCUMENTS

| | | |
|---|---|---|
| 2004/0192398 A1 | 9/2004 | Zhu |
| 2004/0198392 A1 | 10/2004 | Harvey et al. |
| 2004/0235433 A1 | 11/2004 | Hugl et al. |
| 2004/0246048 A1 | 12/2004 | Leyonhjelm et al. |
| 2005/0037733 A1 | 2/2005 | Coleman et al. |
| 2005/0041018 A1 | 2/2005 | Philipp |
| 2005/0075123 A1 | 4/2005 | Jin et al. |
| 2005/0124393 A1 | 6/2005 | Nuovo et al. |
| 2005/0134456 A1 | 6/2005 | Niu et al. |
| 2005/0135324 A1 | 6/2005 | Kim et al. |
| 2005/0136845 A1 | 6/2005 | Masuoka et al. |
| 2005/0208952 A1 | 9/2005 | Dietrich et al. |
| 2005/0227640 A1 | 10/2005 | Haque et al. |
| 2005/0250532 A1 | 11/2005 | Hwang et al. |
| 2006/0019677 A1 | 1/2006 | Teague et al. |
| 2006/0052131 A1 | 3/2006 | Ichihara |
| 2006/0067277 A1 | 3/2006 | Thomas et al. |
| 2006/0077952 A1 | 4/2006 | Kubsch et al. |
| 2006/0099940 A1 | 5/2006 | Pfleging et al. |
| 2006/0103635 A1 | 5/2006 | Park |
| 2006/0181453 A1 | 8/2006 | King et al. |
| 2006/0194593 A1 | 8/2006 | Drabeck et al. |
| 2006/0207806 A1 | 9/2006 | Philipp |
| 2006/0209754 A1 | 9/2006 | Ji et al. |
| 2006/0215618 A1 | 9/2006 | Soliman et al. |
| 2006/0240827 A1 | 10/2006 | Dunn |
| 2006/0245601 A1 | 11/2006 | Michaud et al. |
| 2006/0256887 A1 | 11/2006 | Kwon et al. |
| 2006/0280261 A1 | 12/2006 | Prikhodko et al. |
| 2006/0291393 A1 | 12/2006 | Teague et al. |
| 2006/0292990 A1 | 12/2006 | Karabinis et al. |
| 2007/0004344 A1 | 1/2007 | DeGroot et al. |
| 2007/0008108 A1 | 1/2007 | Schurig et al. |
| 2007/0026838 A1 | 2/2007 | Staudinger et al. |
| 2007/0042714 A1 | 2/2007 | Ayed |
| 2007/0049280 A1 | 3/2007 | Sambhwani et al. |
| 2007/0069735 A1 | 3/2007 | Graf et al. |
| 2007/0091004 A1 | 4/2007 | Puuri |
| 2007/0093281 A1 | 4/2007 | Park et al. |
| 2007/0133462 A1 | 6/2007 | Guey |
| 2007/0153743 A1 | 7/2007 | Mukkavilli et al. |
| 2007/0197180 A1 | 8/2007 | McKinzie et al. |
| 2007/0200766 A1 | 8/2007 | McKinzie et al. |
| 2007/0211657 A1 | 9/2007 | McBeath et al. |
| 2007/0211813 A1 | 9/2007 | Talwar et al. |
| 2007/0222629 A1 | 9/2007 | Yoneyama |
| 2007/0223422 A1 | 9/2007 | Kim et al. |
| 2007/0232370 A1 | 10/2007 | Kim |
| 2007/0238425 A1 | 10/2007 | McFarland |
| 2007/0238496 A1 | 10/2007 | Chung et al. |
| 2007/0243894 A1 | 10/2007 | Das et al. |
| 2007/0255558 A1 | 11/2007 | Yasunaga et al. |
| 2007/0280160 A1 | 12/2007 | Kim et al. |
| 2007/0285326 A1 | 12/2007 | McKinzie |
| 2008/0001915 A1 | 1/2008 | Pihlaja et al. |
| 2008/0002735 A1 | 1/2008 | Poirier et al. |
| 2008/0014960 A1 | 1/2008 | Chou |
| 2008/0026710 A1 | 1/2008 | Buckley |
| 2008/0080449 A1 | 4/2008 | Huang et al. |
| 2008/0089312 A1 | 4/2008 | Malladi |
| 2008/0095109 A1 | 4/2008 | Malladi et al. |
| 2008/0108310 A1 | 5/2008 | Tong et al. |
| 2008/0111714 A1 | 5/2008 | Kremin |
| 2008/0117886 A1 | 5/2008 | Kim |
| 2008/0130626 A1 | 6/2008 | Ventola et al. |
| 2008/0132247 A1 | 6/2008 | Anderson |
| 2008/0133462 A1 | 6/2008 | Aylward et al. |
| 2008/0157893 A1 | 7/2008 | Krah |
| 2008/0159239 A1 | 7/2008 | Odlyzko et al. |
| 2008/0165876 A1 | 7/2008 | Suh et al. |
| 2008/0167040 A1 | 7/2008 | Khandekar et al. |
| 2008/0167073 A1 | 7/2008 | Hobson et al. |
| 2008/0170602 A1 | 7/2008 | Guey |
| 2008/0170608 A1 | 7/2008 | Guey |
| 2008/0186105 A1 | 8/2008 | Scuderi et al. |
| 2008/0192683 A1 | 8/2008 | Han et al. |
| 2008/0212520 A1 | 9/2008 | Chen et al. |
| 2008/0225693 A1 | 9/2008 | Zhang et al. |
| 2008/0227414 A1 | 9/2008 | Karmi et al. |
| 2008/0227481 A1 | 9/2008 | Naguib et al. |
| 2008/0232395 A1 | 9/2008 | Buckley et al. |
| 2008/0267310 A1 | 10/2008 | Khan et al. |
| 2008/0274753 A1 | 11/2008 | Attar et al. |
| 2008/0279300 A1 | 11/2008 | Walker et al. |
| 2008/0298482 A1 | 12/2008 | Rensburg et al. |
| 2008/0307427 A1 | 12/2008 | Pi et al. |
| 2008/0309633 A1 | 12/2008 | Hotelling et al. |
| 2008/0313146 A1 | 12/2008 | Wong et al. |
| 2008/0317259 A1 | 12/2008 | Zhang et al. |
| 2009/0041151 A1 | 2/2009 | Khan et al. |
| 2009/0055170 A1 | 2/2009 | Nagahama |
| 2009/0061790 A1 | 3/2009 | Rofougaran |
| 2009/0061887 A1 | 3/2009 | Hart et al. |
| 2009/0067382 A1 | 3/2009 | Li et al. |
| 2009/0091551 A1 | 4/2009 | Hotelling et al. |
| 2009/0102294 A1 | 4/2009 | Hodges et al. |
| 2009/0121963 A1 | 5/2009 | Greene |
| 2009/0122758 A1 | 5/2009 | Smith et al. |
| 2009/0122884 A1 | 5/2009 | Vook et al. |
| 2009/0228598 A1 | 9/2009 | Stamoulis et al. |
| 2009/0238131 A1 | 9/2009 | Montojo et al. |
| 2009/0243631 A1 | 10/2009 | Kuang |
| 2009/0252077 A1 | 10/2009 | Khandekar et al. |
| 2009/0256644 A1* | 10/2009 | Knudsen et al. ............... 333/32 |
| 2009/0258614 A1 | 10/2009 | Walker |
| 2009/0262699 A1 | 10/2009 | Wdngerter et al. |
| 2009/0264078 A1* | 10/2009 | Yun ..................... H04B 17/16 |
| | | 455/67.11 |
| 2009/0268675 A1 | 10/2009 | Choi |
| 2009/0270103 A1 | 10/2009 | Pani et al. |
| 2009/0285321 A1 | 11/2009 | Schulz et al. |
| 2009/0290544 A1 | 11/2009 | Yano et al. |
| 2009/0295226 A1 | 12/2009 | Hodges et al. |
| 2009/0298433 A1 | 12/2009 | Sorrells et al. |
| 2009/0307511 A1 | 12/2009 | Fiennes et al. |
| 2009/0323608 A1 | 12/2009 | Adachi et al. |
| 2010/0002657 A1 | 1/2010 | Teo et al. |
| 2010/0014690 A1 | 1/2010 | Wolff et al. |
| 2010/0023898 A1 | 1/2010 | Nomura et al. |
| 2010/0034312 A1 | 2/2010 | Muharemovic et al. |
| 2010/0035627 A1 | 2/2010 | Hou et al. |
| 2010/0046460 A1 | 2/2010 | Kwak et al. |
| 2010/0046650 A1 | 2/2010 | Jongren et al. |
| 2010/0056166 A1 | 3/2010 | Tenny |
| 2010/0081487 A1 | 4/2010 | Chen et al. |
| 2010/0085010 A1 | 4/2010 | Suzuki et al. |
| 2010/0103949 A1 | 4/2010 | Jung et al. |
| 2010/0106459 A1 | 4/2010 | Bakalov |
| 2010/0109796 A1 | 5/2010 | Park et al. |
| 2010/0118706 A1 | 5/2010 | Parkvall et al. |
| 2010/0118839 A1 | 5/2010 | Malladi et al. |
| 2010/0156728 A1 | 6/2010 | Alvey et al. |
| 2010/0157858 A1 | 6/2010 | Lee et al. |
| 2010/0157924 A1 | 6/2010 | Prasad et al. |
| 2010/0159833 A1 | 6/2010 | Lewis et al. |
| 2010/0161658 A1 | 6/2010 | Hamynen et al. |
| 2010/0165882 A1 | 7/2010 | Palanki et al. |
| 2010/0167743 A1 | 7/2010 | Palanki et al. |
| 2010/0172310 A1 | 7/2010 | Cheng et al. |
| 2010/0172311 A1 | 7/2010 | Agrawal et al. |
| 2010/0182903 A1 | 7/2010 | Palanki et al. |
| 2010/0189191 A1 | 7/2010 | Taoka et al. |
| 2010/0195566 A1 | 8/2010 | Krishnamurthy et al. |
| 2010/0208838 A1 | 8/2010 | Lee et al. |
| 2010/0217590 A1 | 8/2010 | Nemer et al. |
| 2010/0220801 A1 | 9/2010 | Lee et al. |
| 2010/0260154 A1 | 10/2010 | Frank et al. |
| 2010/0271330 A1 | 10/2010 | Philipp |
| 2010/0272094 A1 | 10/2010 | Byard et al. |
| 2010/0274516 A1 | 10/2010 | Hoebel et al. |
| 2010/0291918 A1 | 11/2010 | Suzuki et al. |
| 2010/0311437 A1 | 12/2010 | Palanki et al. |
| 2010/0317343 A1 | 12/2010 | Krishnamurthy |
| 2010/0322176 A1 | 12/2010 | Chen et al. |

(56) References Cited

U.S. PATENT DOCUMENTS

| | | |
|---|---|---|
| 2010/0323718 A1 | 12/2010 | Jen |
| 2011/0039583 A1 | 2/2011 | Frank et al. |
| 2011/0051834 A1 | 3/2011 | Lee et al. |
| 2011/0080969 A1 | 4/2011 | Jongren et al. |
| 2011/0083066 A1 | 4/2011 | Chung et al. |
| 2011/0085588 A1 | 4/2011 | Zhuang |
| 2011/0085610 A1 | 4/2011 | Zhuang et al. |
| 2011/0096739 A1 | 4/2011 | Heidari et al. |
| 2011/0096915 A1 | 4/2011 | Nemer |
| 2011/0103498 A1 | 5/2011 | Chen et al. |
| 2011/0105023 A1 | 5/2011 | Scheer |
| 2011/0116423 A1 | 5/2011 | Rousu et al. |
| 2011/0116436 A1 | 5/2011 | Bachu et al. |
| 2011/0117925 A1 | 5/2011 | Sampath et al. |
| 2011/0119005 A1 | 5/2011 | Majima et al. |
| 2011/0121836 A1 | 5/2011 | Kim et al. |
| 2011/0143770 A1 | 6/2011 | Charbit et al. |
| 2011/0143773 A1 | 6/2011 | Kangas et al. |
| 2011/0148625 A1 | 6/2011 | Velusamy |
| 2011/0148700 A1 | 6/2011 | Lasagabaster et al. |
| 2011/0149868 A1 | 6/2011 | Krishnamurthy et al. |
| 2011/0149903 A1 | 6/2011 | Krishnamurthy et al. |
| 2011/0157067 A1 | 6/2011 | Wagner et al. |
| 2011/0158200 A1 | 6/2011 | Bachu et al. |
| 2011/0176252 A1 | 7/2011 | DeReus |
| 2011/0189964 A1 | 8/2011 | Jeon et al. |
| 2011/0190016 A1 | 8/2011 | Hamabe et al. |
| 2011/0216840 A1 | 9/2011 | Lee et al. |
| 2011/0244884 A1 | 10/2011 | Kangas et al. |
| 2011/0249637 A1 | 10/2011 | Hammarwall et al. |
| 2011/0250852 A1 | 10/2011 | Greene |
| 2011/0263303 A1 | 10/2011 | Lowles et al. |
| 2011/0268101 A1 | 11/2011 | Wang |
| 2011/0274188 A1 | 11/2011 | Sayana et al. |
| 2011/0281532 A1 | 11/2011 | Shin et al. |
| 2011/0285603 A1 | 11/2011 | Skarp |
| 2011/0286349 A1 | 11/2011 | Tee et al. |
| 2011/0292844 A1 | 12/2011 | Kwun et al. |
| 2011/0319027 A1 | 12/2011 | Sayana |
| 2012/0002609 A1 | 1/2012 | Larsson et al. |
| 2012/0008510 A1 | 1/2012 | Cai et al. |
| 2012/0021769 A1 | 1/2012 | Lindoff et al. |
| 2012/0032646 A1 | 2/2012 | Lee |
| 2012/0039251 A1 | 2/2012 | Sayana |
| 2012/0050122 A1 | 3/2012 | Wu et al. |
| 2012/0052903 A1 | 3/2012 | Han et al. |
| 2012/0071195 A1 | 3/2012 | Chakraborty et al. |
| 2012/0076043 A1 | 3/2012 | Nishio et al. |
| 2012/0077538 A1 | 3/2012 | Yun |
| 2012/0106475 A1 | 5/2012 | Jung |
| 2012/0112851 A1 | 5/2012 | Manssen et al. |
| 2012/0120772 A1 | 5/2012 | Fujisawa |
| 2012/0120934 A1 | 5/2012 | Cho |
| 2012/0122478 A1 | 5/2012 | Siomina et al. |
| 2012/0158839 A1 | 6/2012 | Hassan et al. |
| 2012/0161927 A1 | 6/2012 | Pierfelice et al. |
| 2012/0162129 A1 | 6/2012 | Krah et al. |
| 2012/0170541 A1 | 7/2012 | Love et al. |
| 2012/0177089 A1 | 7/2012 | Pelletier et al. |
| 2012/0178370 A1 | 7/2012 | George |
| 2012/0182144 A1 | 7/2012 | Richardson et al. |
| 2012/0206556 A1 | 8/2012 | Yu et al. |
| 2012/0214412 A1 | 8/2012 | Schlub et al. |
| 2012/0214421 A1 | 8/2012 | Hoirup et al. |
| 2012/0214549 A1 | 8/2012 | Philbin |
| 2012/0220243 A1 | 8/2012 | Mendolia |
| 2012/0224715 A1 | 9/2012 | Kikkeri |
| 2012/0295554 A1 | 11/2012 | Greene et al. |
| 2012/0295555 A1 | 11/2012 | Greene et al. |
| 2012/0302188 A1 | 11/2012 | Sahota et al. |
| 2012/0306716 A1 | 12/2012 | Satake et al. |
| 2012/0309388 A1 | 12/2012 | Moosavi et al. |
| 2012/0309413 A1 | 12/2012 | Grosman et al. |
| 2012/0316967 A1 | 12/2012 | Mgrdechian et al. |
| 2013/0030803 A1 | 1/2013 | Liao |
| 2013/0034241 A1 | 2/2013 | Pandey et al. |
| 2013/0039284 A1 | 2/2013 | Marinier et al. |
| 2013/0040578 A1 | 2/2013 | Khoshnevis et al. |
| 2013/0059600 A1 | 3/2013 | Elsom-Cook et al. |
| 2013/0078980 A1 | 3/2013 | Saito |
| 2013/0094484 A1 | 4/2013 | Kneckt et al. |
| 2013/0109314 A1 | 5/2013 | Kneckt et al. |
| 2013/0109334 A1 | 5/2013 | Kwon et al. |
| 2013/0142113 A1 | 6/2013 | Fong et al. |
| 2013/0150092 A1 | 6/2013 | Frank et al. |
| 2013/0178175 A1 | 7/2013 | Kato |
| 2013/0194154 A1 | 8/2013 | Baliarda et al. |
| 2013/0195283 A1 | 8/2013 | Larson et al. |
| 2013/0195296 A1 | 8/2013 | Merks |
| 2013/0231151 A1 | 9/2013 | Kneckt et al. |
| 2013/0286937 A1 | 10/2013 | Liu et al. |
| 2013/0307735 A1 | 11/2013 | Contreras et al. |
| 2013/0310102 A1 | 11/2013 | Chao et al. |
| 2013/0316687 A1 | 11/2013 | Subbaramoo et al. |
| 2013/0322375 A1 | 12/2013 | Chang et al. |
| 2013/0322562 A1 | 12/2013 | Zhang et al. |
| 2013/0322655 A1 | 12/2013 | Schuldt et al. |
| 2013/0325149 A1 | 12/2013 | Manssen et al. |
| 2014/0024321 A1 | 1/2014 | Zhu et al. |
| 2014/0044126 A1 | 2/2014 | Sabhanatarajan et al. |
| 2014/0045422 A1 | 2/2014 | Qi et al. |
| 2014/0068288 A1 | 3/2014 | Robinson et al. |
| 2014/0092830 A1 | 4/2014 | Chen et al. |
| 2014/0093091 A1 | 4/2014 | Dusan et al. |
| 2014/0177686 A1 | 6/2014 | Greene et al. |
| 2014/0185498 A1 | 7/2014 | Schwent et al. |
| 2014/0227981 A1 | 8/2014 | Pecen et al. |
| 2014/0273882 A1 | 9/2014 | Asrani et al. |
| 2014/0273886 A1 | 9/2014 | Black et al. |
| 2014/0313088 A1 | 10/2014 | Rozenblit et al. |
| 2014/0349593 A1 | 11/2014 | Danak et al. |
| 2014/0376652 A1 | 12/2014 | Sayana et al. |
| 2014/0379332 A1 | 12/2014 | Rodriguez et al. |
| 2015/0017978 A1 | 1/2015 | Hong et al. |
| 2015/0024786 A1 | 1/2015 | Asrani et al. |
| 2015/0031420 A1 | 1/2015 | Higaki et al. |
| 2015/0072632 A1 | 3/2015 | Pourkhaatoun et al. |
| 2015/0080047 A1 | 3/2015 | Russell et al. |
| 2015/0092954 A1 | 4/2015 | Coker et al. |
| 2015/0171919 A1 | 6/2015 | Ballantyne et al. |
| 2015/0181388 A1 | 6/2015 | Smith |
| 2015/0236828 A1 | 8/2015 | Park et al. |
| 2015/0245323 A1 | 8/2015 | You et al. |
| 2015/0280876 A1 | 10/2015 | You et al. |
| 2015/0349410 A1 | 12/2015 | Russell et al. |
| 2015/0365065 A1 | 12/2015 | Higaki et al. |
| 2016/0014727 A1 | 1/2016 | Nimbalker |
| 2016/0036482 A1 | 2/2016 | Black et al. |
| 2016/0080053 A1 | 3/2016 | Sayana et al. |

FOREIGN PATENT DOCUMENTS

| | | |
|---|---|---|
| CN | 1984476 | 6/2007 |
| CN | 101035379 | 9/2007 |
| DE | 10053205 | 5/2002 |
| DE | 10118189 | 11/2002 |
| EP | 0695059 | 1/1996 |
| EP | 1158686 | 11/2001 |
| EP | 1298809 | 4/2003 |
| EP | 1357543 | 10/2003 |
| EP | 1511010 | 3/2005 |
| EP | 1753152 | 2/2007 |
| EP | 1443791 | 2/2009 |
| EP | 2487967 | 8/2012 |
| EP | 2255443 | 11/2012 |
| EP | 2557433 | 2/2013 |
| EP | 2568531 A1 | 3/2013 |
| EP | 2590258 A1 | 5/2013 |
| JP | H09247852 | 9/1997 |
| JP | 2000-286924 A | 10/2000 |
| KR | 20050058333 | 6/2005 |
| RU | 2005113251 | 1/2006 |
| WO | WO-9306682 | 4/1993 |
| WO | WO-9416517 | 7/1994 |

(56) References Cited

FOREIGN PATENT DOCUMENTS

| WO | WO-9600401 | 1/1996 |
|----|----|----|
| WO | WO-9921389 | 4/1999 |
| WO | WO-9950968 | 10/1999 |
| WO | WO-0111721 | 2/2001 |
| WO | WO-03007508 | 1/2003 |
| WO | WO-03107327 | 12/2003 |
| WO | WO-2004021634 | 3/2004 |
| WO | WO-2004040800 | 5/2004 |
| WO | WO 2004/084427 A1 | 9/2004 |
| WO | WO-2004084447 | 9/2004 |
| WO | WO-2006039434 | 4/2006 |
| WO | WO-2006046192 | 5/2006 |
| WO | WO-2006130278 | 12/2006 |
| WO | WO-2007052115 | 5/2007 |
| WO | WO-2007080727 | 7/2007 |
| WO | WO-2008027705 | 3/2008 |
| WO | WO-2008033117 | 3/2008 |
| WO | WO-2008085107 | 7/2008 |
| WO | WO-2008085416 | 7/2008 |
| WO | WO-2008085720 | 7/2008 |
| WO | WO-2008112849 | 9/2008 |
| WO | WO-2008113210 | 9/2008 |
| WO | WO-2008137354 | 11/2008 |
| WO | WO-2008137607 | 11/2008 |
| WO | WO-2008156081 | 12/2008 |
| WO | WO-2009107090 | 9/2009 |
| WO | WO-2010080845 | 7/2010 |
| WO | WO-2010124244 | 10/2010 |
| WO | WO-2010138039 | 12/2010 |
| WO | WO-2012115649 | 8/2012 |
| WO | WO-2012149968 | 11/2012 |
| WO | WO-2012177939 | 12/2012 |
| WO | WO-2013131268 | 9/2013 |

OTHER PUBLICATIONS

"3rd Generation Partnership Project; Technical Specification Group Radio Access Network", 3GPP TR 36.814 V9.0.0 (Mar. 2010), Further Advancements for E-UTRA Physical Layer Aspects (Release 9), 104 pages.
"A feedback framework based on W2W1 for Rei. 10", 3GPP TSG RAN WG1 #61bis, R1-103664,, Jun. 2010, 19 pages.
"Addition of PRS Muting Configuration Information to LPPa", 3GPP TSG RAN3 #68, Montreal, Canada; Ericsson, R3-101526, May 2010, 7 pages.
"Advisory Action", U.S. Appl. No. 12/650,699, Jan. 30, 2013, 3 pages.
"Advisory Action", U.S. Appl. No. 12/650,699, Sep. 25, 2014, 3 pages.
"An-1432 The LM4935 Headset and Push-Button Detection Guide", Texas Instruments Incorporated—http://www.ti.com/lit/an/snaa024a.snaa024a.pdf, May 2013, 8 pages.
"Best Companion reporting for improved single-cell MU-MIMO pairing", 3GPP TSG RAN WG1 #56; Athens, Greece; Alcatei-Lucent, R1-090926, Feb. 2009, 5 pages.
"Change Request—Clarification of the CP length of empty OFDM symbols in PRS subframes", 3GPP TSG RAN WG1 #59bis, Jeju, Vaiencia, Spain, ST-Ericsson, Motorola, Qualcomm Inc, R1-100311;, Jan. 2009, 2 pages.
"Change Request 36.211—Introduction of L TE Positioning", 3GPP TSG RAN WG1 #59, Jeju, South Korea; Ericsson, R1-095027, May 2010, 6 pages.
"Change Request 36.213 Clarification of POSCH and PRS in combination for L TE positioning", 3GPP TSG RAN WG1 #58bis, Miyazaki, Japan; Ericsson, et al., R1-094262;, Oct. 2009, 4 pages.
"Change Request 36.214—Introduction of LTE Positioning", 3GPP TSG RAN WG1 #59, Jeju, South Korea, Ericsson, et al., R1-094430, Nov. 2009, 4 pages.
"Companion Subset Based PMI/CQI Feedback for LTE-A MU-MIMO", 3GPP TSG RAN WG1 #60; San Francisco, USA, RIM; R1-101104, Feb. 2010, 8 pages.
"Comparison of PMI-based and SCF-based MU-MIMO", 3GPP TSG RAN1 #58; Shenzhen, China; R1-093421,, Aug. 2009, 5 pages.
"Development of two-stage feedback framework for Rel-10", 3GPP TSG RAN WG1 #60bis Meeting, R1-101859, Alcatel-Lucent Shanghai Bell, Alcatel-Lucent, Apr. 2010, 5 pages.
"Digital cellular telecommunications system (Phase 2+)", Location Services (LCS); Broadcast Network Assistance for Enhanced Observed Time Difference (E-OTD) and Global Positioning System (GPS) Positioning Methods (3GPP TS 04.35 version 8.3.0 Release 1999), 2001, 37 pages.
"Discussions on UE positioning issues", 3GPP TSG-RAN WG1 #57 R1-091911, San Francisco, USA,, May 2009, 12 pages.
"DL Codebook design for 8Tx preceding", 3GPP TSG RAN WG1 #60bis, R1-102380, LG Electronics, Beijing, China, Apr. 2010, 4 pages.
"Double codebook design principles", 3GPP TSG RAN WG1 #61bis, R1-103804, Nokia, Nokia Siemens Networks, Dresden, Germany, Jun. 2010, 9 pages.
"Earbud with Push-to-Talk Microphone", Motorola, Inc., model 53727, iDEN 2.5 mm 4-pole mono PTT headset NNTNN5006BP, 2013, 10 pages.
"Evaluation of protocol architecture alternatives for positioning", 3GPP TSG-RAN WG2 #66bis R2-093855, Los Angeles, CA, USA, Jun. 2009, 4 pages.
"Ex Parte Quayle Action", U.S. Appl. No. 13/088,237, Dec. 19, 2012, 5 pages.
"Extended European Search Report", EP Application No. 12196319.3, Feb. 27, 2014, 7 pages.
"Extended European Search Report", EP Application No. 12196328.4, Feb. 26, 2014, 7 pages.
"Extensions to Rel-8 type CQI/PMI/RI feedback using double codebook structure", 3GPP TSG RAN WG1#59bis, R1-100251, Valencia, Spain,, Jan. 2010, 4 pages.
"Feedback Codebook Design and Performance Evaluation", 3GPP TSG RAN WG1 #61bis, R1-103970, LG Electronics, Jun. 2010, 6 pages.
"Feedback considerations for DL MIMO and CoMP", 3GPP TSG RAN WG1 #57bis; Los Angeles, USA; Qualcomm Europe; R1-092695, Jun. 2009, 6 pages.
"Final Improvement Proposal for PTT Support in HFP", Bluetooth Sig, Inc., revision V10r00 (PTTinHFP_FIPD), Jul. 20, 2010, 50 pages.
"Final Office Action", U.S. Appl. No. 12/407,783, Feb. 15, 2012, 18 pages.
"Final Office Action", U.S. Appl. No. 12/573,456, Mar. 21, 2012, 12 pages.
"Final Office Action", U.S. Appl. No. 12/650,699, Jul. 16, 2014, 20 pages.
"Final Office Action", U.S. Appl. No. 12/650,699, Jul. 29, 2015, 26 pages.
"Final Office Action", U.S. Appl. No. 12/650,699, Nov. 13, 2012, 17 pages.
"Final Office Action", U.S. Appl. No. 12/756,777, Nov. 1, 2013, 12 pages.
"Final Office Action", U.S. Appl. No. 12/899,211, Oct. 24, 2013, 17 pages.
"Final Office Action", U.S. Appl. No. 13/477,609, Jul. 31, 2015, 11 pages.
"Final Office Action", U.S. Appl. No. 13/721,771, Oct. 29, 2015, 8 pages.
"Final Office Action", U.S. Appl. No. 13/733,297, Jul. 22, 2015, 20 pages.
"Final Office Action", U.S. Appl. No. 13/873,557, Jul. 17, 2015, 13 pages.
"Final Office Action", U.S. Appl. No. 14/012,050, Jul. 6, 2015, 23 pages.
"Final Office Action", U.S. Appl. No. 14/052,903, Oct. 1, 2015, 10 pages.
"Final Office Action", U.S. Appl. No. 14/150,047, Mar. 4, 2016, 14 pages.
"Foreign Office Action", CN Application No. 201080025882.7, Feb. 8, 2014, 19 pages.

(56) References Cited

OTHER PUBLICATIONS

"Further details on DL OTDOA", 3GPP TSG RAN WG1 #56bis, Seoul, South Korea—Ericsson, R1-091312,, Mar. 2009, 6 pages.
"Further Refinements of Feedback Framework", 3GPP TSG-RAN WG1 #60bis R1101742; Ericsson, ST-Ericsson, Apr. 2010, 8 pages.
"IEEE 802.16m System Description Document [Draft]", IEEE 802.16 Broadband Wireless Access Working Group, Nokia, Feb. 7, 2009, 171 pages.
"Implicit feedback in support of downlink MU-MIMO" Texas Instruments, 3GPP TSG RAN WG1 #58; Shenzhen, China, R1-093176, Aug. 2009, 4 pages.
"Improving the hearability of LTE Positioning Service", 3GPP TSG RAN WG1 #55bis; Alcatei-Lucent, R1-090053,, Jan. 2009, 5 pages.
"Innovator in Electronics, Technical Update, Filters & Modules PRM Alignment", Module Business Unit, Apr. 2011, 95 pages.
"International Preliminary Report on Patentability", Application No. PCT/US2013/042042, Mar. 10, 2015, 8 pages.
"International Search Report and Written Opinion", Application No. PCT/US2014/060440, Feb. 5, 2015, 11 pages.
"International Search Report and Written Opinion", Application No. PCT/US2015/031328, Aug. 12, 2015, 11 pages.
"International Search Report and Written Opinion", Application No. PCT/US2014/045755, Oct. 23, 2014, 11 pages.
"International Search Report and Written Opinion", Application No. PCT/US2014/045956, Oct. 31, 2014, 11 pages.
"International Search Report and Written Opinion", Application No: PCT/US2014/056642, Dec. 9, 2014, 11 pages.
"International Search Report and Written Opinion", Application No. PCT/US2013/071615, Mar. 5, 2014, 13 pages.
"International Search Report and Written Opinion", Application No. PCT/US2013/040242, Oct. 4, 2013, 14 pages.
"International Search Report and Written Opinion", Application No. PCT/US2014/047233, Jan. 22, 2015, 8 pages.
"International Search Report and Written Opinion", Application No. PCT/US2013/077919, Apr. 24, 2014, 8 pages.
"International Search Report and Written Opinion", Application No. PCT/US2014/070925, May 11, 2015, 9 pages.
"International Search Report and Written Opinion", Application No. PCT/US2014/018564, Jun. 18, 2014, 11 pages.
"International Search Report and Written Opinion", Application No. PCT/US2013/072718, Jun. 18, 2014, 12 pages.
"International Search Report and Written Opinion", Application No. PCT/US2010/026579, Feb. 4, 2011, 13 pages.
"International Search Report and Written Opinion", Application No. PCT/US2011/034959, Aug. 16, 2011, 13 pages.
"International Search Report and Written Opinion", Application No. PCT/US2011/045209, Oct. 28, 2011, 14 pages.
"International Search Report and Written Opinion", Application No. PCT/US2011/039214, Sep. 14, 2011, 9 pages.
"International Search Report and Written Opinion", Application No. PCT/US2010/038257, Oct. 1, 2010, 9 pages.
"International Search Report and Written Opinion", Application No. PCT/US2010/034023, Dec. 1, 2010, 9 pages.
"International Search Report", Application No. PCT/US20013/071616, Mar. 5, 2014, 2 pages.
"International Search Report", Application No. PCT/US2010/030516, Oct. 8, 2010, 5 pages.
"International Search Report", Application No. PCT/US2010/036982, Nov. 22, 2010, 4 pages.
"International Search Report", Application No. PCT/US2010/041451, Oct. 25, 2010, 3 pages.
"International Search Report", Application No. PCT/US2011/044103, Oct. 24, 2011, 3 pages.
"International Search Report", Application No. PCT/US2014/014375, Apr. 7, 2014, 4 pages.
"Introduction of L TE Positioning", 3GPP TSG RAN WG1 #58, Shenzhen, China, R1-093604; Draft CR 36.213, Aug. 2009, 3 pages.
"Introduction of L TE Positioning", 3GPP TSG RAN WG1 #59, Jeju, South Korea, Ericsson et al.; R1-094429,, Nov. 2009, 5 pages.
"Introduction of LTE Positioning,", 3GPP TSG RAN WG1 #58, Shenzhen, China; Draft CR 36.214; R1-093605;, Aug. 2009, 6 pages.
"Introduction of LTE Positioning,", 3GPP TSG-RAN WG1 Meeting #58, R1-093603, Shenzhen, China,, Aug. 2009, 5 pages.
"LS on 12 5. Assistance Information for OTDOA Positioning Support for L TE Rel-9", 3GPP TSG RAN WG1 Meeting #58; Shenzhen, China; R1-093729, Aug. 2009, 3 pages.
"LS on LTE measurement supporting Mobility", 3GPP TSG WG1 #48, Tdoc R1-071250; StLouis, USA, Feb. 2007, 2 pages.
"LTE Positioning Protocol (LPP)", 3GPP TS 36.355 V9.0.0 (Dec. 2009); 3rd Generation Partnership Project; Technical Specification Group Radio Access Network; Evolved Universal Terrestrial Radio Access (E-UTRA); Release 9, Dec. 2009, 102 pages.
"Market & Motivation (MRD Section3) for Interoperability Testing of Neighbor Awareness Networking", WiFi Alliance Neighbor Awareness Networking Marketing Task Group, Version 0.14, 2011, 18 pages.
"Marketing Statement of Work Neighbor Awareness Networking", Version 1.17, Neighbor Awareness Networking Task Group, May 2012, 18 pages.
"Method for Channel Quality Feedback in Wireless Communication Systems", U.S. Appl. No. 12/823,178, filed Jun. 25, 2010, 34 pages.
"Motorola SJYN0505A Stereo Push to Talk Headset for Nextel", Motorola Inc., iDEN 5-pole 2.5 mm Stereo Headset SJYN05058A, 2010, 2 pages.
"Non-Final Office Action", U.S. Appl. No. 12/407,783, Sep. 9, 2013, 16 pages.
"Non-Final Office Action", U.S. Appl. No. 12/407,783, Oct. 5, 2011, 14 pages.
"Non-Final Office Action", U.S. Appl. No. 12/480,289, Jun. 9, 2011, 20 pages.
"Non-Final Office Action", U.S. Appl. No. 12/492,339, Aug. 19, 2011, 13 pages.
"Non-Final Office Action", U.S. Appl. No. 12/542,374, Feb. 24, 2014, 25 pages.
"Non-Final Office Action", U.S. Appl. No. 12/542,374, Aug. 7, 2013, 22 pages.
"Non-Final Office Action", U.S. Appl. No. 12/542,374, Aug. 31, 2012, 27 pages.
"Non-Final Office Action", U.S. Appl. No. 12/542,374, Dec. 23, 2011, 22 pages.
"Non-Final Office Action", U.S. Appl. No. 12/573,456, Nov. 18, 2011, 9 pages.
"Non-Final Office Action", U.S. Appl. No. 12/577,553, Feb. 4, 2014, 10 pages.
"Non-Final Office Action", U.S. Appl. No. 12/577,553, Aug. 12, 2013, 11 pages.
"Non-Final Office Action", U.S. Appl. No. 12/577,553, Dec. 28, 2011, 7 pages.
"Non-Final Office Action", U.S. Appl. No. 12/650,699, Mar. 30, 2015, 28 pages.
"Non-Final Office Action", U.S. Appl. No. 12/650,699, Apr. 23, 2013, 19 pages.
"Non-Final Office Action", U.S. Appl. No. 12/650,699, Jul. 19, 2012, 12 pages.
"Non-Final Office Action", U.S. Appl. No. 12/650,699, Dec. 16, 2013, 26 pages.
"Non-Final Office Action", U.S. Appl. No. 12/756,777, Apr. 19, 2013, 17 pages.
"Non-Final Office Action", U.S. Appl. No. 12/813,221, Oct. 8, 2013, 10 pages.
"Non-Final Office Action", U.S. Appl. No. 12/823,178, Aug. 23, 2012, 15 pages.
"Non-Final Office Action", U.S. Appl. No. 12/899,211, Apr. 10, 2014, 12 pages.
"Non-Final Office Action", U.S. Appl. No. 12/899,211, May 22, 2013, 17 pages.
"Non-Final Office Action", U.S. Appl. No. 12/973,467, Mar. 28, 2013, 9 pages.
"Non-Final Office Action", U.S. Appl. No. 13/477,609, Dec. 3, 2014, 7 pages.

(56) References Cited

OTHER PUBLICATIONS

"Non-Final Office Action", U.S. Appl. No. 13/477,609, Dec. 14, 2015, 9 pages.
"Non-Final Office Action", U.S. Appl. No. 13/692,520, Sep. 5, 2014, 15 pages.
"Non-Final Office Action", U.S. Appl. No. 13/692,520, Oct. 5, 2015, 17 pages.
"Non-Final Office Action", U.S. Appl. No. 13/721,771, May 20, 2015, 6 pages.
"Non-Final Office Action", U.S. Appl. No. 13/733,297, Feb. 2, 2016, 17 pages.
"Non-Final Office Action", U.S. Appl. No. 13/733,297, Mar. 13, 2015, 23 pages.
"Non-Final Office Action", U.S. Appl. No. 13/759,089, Apr. 18, 2013, 16 pages.
"Non-Final Office Action", U.S. Appl. No. 13/873,557, Mar. 11, 2015, 19 pages.
"Non-Final Office Action", U.S. Appl. No. 13/924,838, Nov. 28, 2014, 6 pages.
"Non-Final Office Action", U.S. Appl. No. 13/945,968, Apr. 28, 2015, 16 pages.
"Non-Final Office Action", U.S. Appl. No. 13/955,723, Dec. 17, 2015, 21 pages.
"Non-Final Office Action", U.S. Appl. No. 14/012,050, Feb. 10, 2015, 18 pages.
"Non-Final Office Action", U.S. Appl. No. 14/031,739, Aug. 18, 2015, 16 pages.
"Non-Final Office Action", U.S. Appl. No. 14/052,903, Mar. 11, 2015, 7 pages.
"Non-Final Office Action", U.S. Appl. No. 14/068,309, Oct. 2, 2015, 14 pages.
"Non-Final Office Action", U.S. Appl. No. 14/150,047, Jun. 29, 2015, 11 pages.
"Non-Final Office Action", U.S. Appl. No. 14/226,041, Jun. 5, 2015, 8 pages.
"Non-Final Office Action", U.S. Appl. No. 14/330,317, Feb. 25, 2016, 14 pages.
"Non-Final Office Action", U.S. Appl. No. 14/339,476, Jan. 20, 2016, 9 pages.
"Non-Final Office Action", U.S. Appl. No. 14/445,715, Jan. 15, 2016, 26 pages.
"Non-Final Office Action", U.S. Appl. No. 14/952,738, Jan. 11, 2016, 7 pages.
"Notice of Allowance", U.S. Appl. No. 12/365,166, Apr. 16, 2010, 7 pages.
"Notice of Allowance", U.S. Appl. No. 12/365,166, Aug. 25, 2010, 4 pages.
"Notice of Allowance", U.S. Appl. No. 12/650,699, Jan. 14, 2016, 8 pages.
"Notice of Allowance", U.S. Appl. No. 13/040,090, Mar. 8, 2012, 6 pages.
"Notice of Allowance", U.S. Appl. No. 13/088,237, Jun. 17, 2013, 8 pages.
"Notice of Allowance", U.S. Appl. No. 13/088,237, Jul. 11, 2013, 8 pages.
"Notice of Allowance", U.S. Appl. No. 13/188,419, May 22, 2013, 8 pages.
"Notice of Allowance", U.S. Appl. No. 13/873,557, Dec. 23, 2015, 10 pages.
"Notice of Allowance", U.S. Appl. No. 13/924,838, Mar. 12, 2015, 7 pages.
"Notice of Allowance", U.S. Appl. No. 13/924,838, Jul. 8, 2015, 7 pages.
"Notice of Allowance", U.S. Appl. No. 13/945,968, Sep. 16, 2015, 6 pages.
"Notice of Allowance", U.S. Appl. No. 14/012,050, Dec. 14, 2015, 12 pages.
"Notice of Allowance", U.S. Appl. No. 14/031,739, Mar. 1, 2016, 7 pages.
"Notice of Allowance", U.S. Appl. No. 14/052,903, Feb. 1, 2016, 8 pages.
"Notice of Allowance", U.S. Appl. No. 14/226,041, Dec. 31, 2015, 5 pages.
"Notice of Allowance", U.S. Appl. No. 14/488,709, Sep. 23, 2015, 10 pages.
"On Extensions to Rel-8 PMI Feedback", 3GPP TSG RAN WG1 #60, R1-101129, Motorola, San Francisco, USA,, Feb. 2010, 4 pages.
"On OTDOA in LTE", 3GPP TSG RAN WG1 #55bis, Ljubljana, Slovenia; R1-090353, Jan. 2009, 8 pages.
"On OTDOA method for L TE Positioning", 3GPP TSG RAN WG1 #56, Ericsson, R1-090918, Athens, Greece, Feb. 2009, 6 pages.
"On Serving Cell Muting for OTDOA Measurements", 3GPP TSG RAN1 #57, R1-092628—Los Angeles, CA, USA, Jun. 2009, 7 pages.
"Performance evaluation of adaptive codebook as enhancement of 4 Tx feedback", 3GPP TSG RAN WG1#61bis, R1-103447, Jul. 2010, 6 pages.
"Phy Layer 1 1 4. Specification Impact of Positioning Improvements", 3GPP TSG RAN WG1 #56bis, Athens, Greece; Qualcomm Europe, R1-090852,, Feb. 2009, 3 pages.
"Physical Channels and Modulation (Release 8)", 3GPP TS 36.211 V8.6.0 (Mar. 2009) 3rd Generation Partnership Project; Technical Specification Group Radio Access 28 Network; Evolved Universal Terrestrial Radio Access (E-UTRA);, Mar. 2009, 83 pages.
"Physical Channels and Modulation (Release 9)", 3GPP TS 36.211 V9.0.0 (Dec. 2009); 3rd Generation Partnership Project; Technical Specification Group Radio Access Network; Evolved Universal Terrestrial Radio Access (E-UTRA); Release 9, Dec. 2009, 85 pages.
"Physical layer procedures", 3GPP TS 36.213 V9.0.1 (Dec. 2009); 3rd Generation Partnership Project; Technical Specification Group Radio Access Network; Evolved Universal Terrestrial Radio Access (E-UTRA); Release 9, Dec. 2009, 79 pages.
"Positioning Subframe Muting for OTDOA Measurements", 3GPP TSG RAN1 #58 R1-093406, Shenzhen, P. R. China, Aug. 2009, 9 pages.
"Positioning Support for L TE", 3GPP TSG RAN WG1 #42, Athens, Greece, RP-080995, Dec. 2008, 5 pages.
"Pre-Brief Appeal Conference Decision", U.S. Appl. No. 12/650,699, Apr. 9, 2013, 2 pages.
"Rationale for mandating simulation of 4Tx Widely-Spaced Cross-Polarized Antenna Configuration for LTE-Advanced MU-MIMO", 3GPP TSG-RAN WG1 Meeting #61bis, R1-104184, Dresden, Germany, Jun. 2010, 5 pages.
"Reference Signals for Low Interference Subframes in Downlink;", 3GPP TSG RAN WG1 Meeting #56bis; Seoul, South Korea; Ericsson; R1-091314, Mar. 2009, 8 pages.
"Restriction Requirement", U.S. Appl. No. 13/721,771, Mar. 16, 2015, 5 pages.
"Restriction Requirement", U.S. Appl. No. 14/031,739, Apr. 28, 2015, 7 pages.
"Signalling Support for PRS Muting in", 3GPP TSG RAN2 #70, Montreal, Canada; Ericsson, ST-Ericsson; R2-103102, May 2010, 2 pages.
"Some Results on DL-MIMO Enhancements for LTE-A", 3GPP TSG WG1 #55bis, R1-090328, Motorola; Ljubjana, Slovenia, Jan. 2009, 5 pages.
"Sounding RS Control Signaling for Closed Loop Antenna Selection", 3GPP TSG RAN #51, R1-080017—Mitsubishi Electric, Jan. 2008, 8 pages.
"Study on hearability of reference signals in LTE positioning support", 3GPP TSG RAN1 #56bisa—R1-091336, Seoul, South Korea, Mar. 2009, 8 pages.
"Supplemental Notice of Allowance", U.S. Appl. No. 14/488,709, Oct. 7, 2015, 8 pages.
"System Simulation Results for OTDOA", 3GPP TSG RAN WG4 #53, Jeju, South Korea, Ericsson, R4-094532;, Nov. 2009, 3 pages.
"Technical 1 34. Specification Group Radio Access Network; Evolved Universal Terrestrial Radio Access (E-UTRA);", 3GPP TS 36.211 v8.4.0 (Sep. 2008); 3rd Generation Partnership Project; Physical Channels and Modulation (Release 8), 2008, 78 pages.

(56) References Cited

OTHER PUBLICATIONS

"Technical Specification Group Radio Access Network", 3GPP Ts 25.305 V8.1.0 (Dec. 2008) 3rd Generation Partnership Project; Stage 2 functional specification of User Equipment (UE) positioning in UTRAN (Release 8), 2008, 79 pages.
"Technical Specification Group Radio Access Network; Evolved Universal Terrestrial Radio Access (E-UTRA)", 3GPP TS 36.305 V0.2.0 (May 2009) 3rd generation Partnership Project; Stage 2 functional specification of User Equipment, (UE) positioning in E-UTRAN (Release 9);, 2010, 52 pages.
"Text 1 3 0. proposal on Orthonogonal PRS transmissions in mixed CP deployments using MBSFN subframes", 3GPP TSG RAN WG1 #59, Jeju, South Korea, Motorola, R1-095003;, Nov. 2009, 4 pages.
"Text proposal on measurements", 3GPP TSG RAN2 #60bis, Tdoc R2-080420; Motorola, Sevilla, Spain, Jan. 2008, 9 pages.
"Two Component Feedback Design and Codebooks", 3GPP TSG RAN1 #61, R1-103328, Motorola, Montreal, Canada, May 2010, 7 pages.
"Two-Level Codebook design for MU MIMO enhancement", 3GPP TSG RAN WG1 #60, R1-102904, Montreal, Canada, May 2010, 8 pages.
"UTRAN SFN-SFN observed lime 11 difference measurement & 3GPP TS 25.311 IE 10.3.7.106 "UE positioning OTDOA neighbour cell info' assistance data D fields"", 3GPP TSG RAN WG4 (Radio) #20, New Jersey, USA; Tdoc R4-011408,, Nov. 2001, 4 pages.
"View on the feedback framework for Rei. 1 0", 3GPP TSG RAN WG1 #61, R1-103026, Samsung, Montreal, Canada, May 2010, 15 pages.
"Views on Codebook Design for Downlink 8Tx MIMO", 3GPP TSG RAN WG1 #60. R1-101219, San Francisco, USA, Feb. 2010, 9 pages.
Colin,"Restrictions on Autonomous Muting to Enable 1 58. Time Difference of Arrival Measurements", U.S. Appl. No. 61/295,678, filed Jan. 15, 2010, 26 pages.
Costas,"A Study of a Class of Detection Waveforms Having Nearly Ideal Range-Doppler Ambiguity Properties", Fellow, IEEE; Proceedings of the IEEE, vol. 72, No. 8, Aug. 1984, 14 pages.
Guo,"A Series-Shunt Symmetric Switch Makes Transmit-Receive Antennas Reconfigurable in Multipath Channels", IEEE 3d Int'l Conf. on Digital Object Identifier, May 29, 2011, pp. 468-471.
Jafar,"On Optimality of Beamforming for Multiple Antenna Systems with Imperfect Feedback", Department of Electrical Engineering, Stanford University, CA, USA, 2004, 7 pages.
Knoppert,"Communication Device", U.S. Appl. No. 29/329,028, filed Dec. 8, 2008, 10 pages.
Knoppert,"Indicator Shelf for Portable Electronic Device", U.S. Appl. No. 12/480,289, filed Jun. 8, 2009, 15 pages.
Krishnamurthy,"Interference Control, SINR Optimization and Signaling Enhancements to Improve the Performance of OTDOA Measurements", U.S. Appl. No. 12/813,221, filed Jun. 10, 2010, 20 pages.
Krishnamurthy,"Threshold Determination in TDOA-Based Positioning System", U.S. Appl. No. 12/712,191, filed Feb. 24, 2010, 19 pages.
Li,"A Subband Feedback Controlled Generalized Sidelobe Canceller in Frequency Domain with Multi-Channel Postfilter", 2nd International Workshop on Intelligent Systems and Applications (ISA), IEEE, May 22, 2010, 4 pages.
MacCm"GaAs SP6T 2.5V High Power Switch Dual-/Tri-/Quad-Band GSM Applications", Rev. V1 data sheet, www.macomtech.com, Mar. 22, 2003, 5 pages.
Renesas,"uPG2417T6M GaAs Integrated Circuit SP6T Switch for NFC Application (RO9DS0010EJ0100)", Rev. 1.00 data sheet, Dec. 24, 2010, 12 pages.
Sayana,"Method of Codebook Design and Precoder Feedback in Wireless Communication Systems", U.S. Appl. No. 61/374,241, filed Aug. 16, 2010, 40 pages.
Sayana,"Method of Precoder Information Feedback in Multi-Antenna Wireless Communication Systems", U.S. Appl. No. 61/331,818, filed May 5, 2010, 43 pages.
Tesoriero,"Improving Location Awareness in Indoor Spaces Using RFID Technology", ScienceDirect, Expert Systems with Applications, 2010, 894-898.
Valkonen,"Impedance Matching and Tuning of Non-Resonant Mobile Terminal Antennas", Aalto University Doctoral Dissertations, Mar. 15, 2013, 94 pages.
Visotsky,"Space-Time Transmit Precoding With Imperfect Feedback", IEEE Transactions on Information Theory, vol. 47, No. 6, Sep. 2001, pp. 2632-2639.
Vodafone"PDCCH Structure for MMTC Enhanced Coverage", 3GPP TSG RAN WG1 #76, R1-141030, Prague, Czech Republic, Feb. 2014, 2 pages.
Yun,"Distributed Self-Pruning(DSP) Algorithm for Bridges in Clustered Ad Hoc Networks", Embedded Software and Systems; Lecture Notes in Computer Science, Springer, May 14, 2007, pp. 699-707.
Zhuang,"Method for Precoding Based on Antenna Grouping", U.S. Appl. No. 12/899,211, filed Oct. 6, 2010, 26 pages.
"Coverage enhancement for RACH messages", 3GPP TSG-RAN WG1 Meeting #76, R1-140153, Alcatel-Lucent, Alcatel-Lucent Shanghai Bell, Feb. 2014, 5 pages.
"Coverage Improvement for PRACH", 3GPP TSG RAN WG1 Meeting #76-R1-140115, Intel Corporation, Feb. 2014, 9 pages.
"Final Office Action", U.S. Appl. No. 13/692,520, May 26, 2016, 25 pages.
"International Search Report and Written Opinion", Application No. PCT/US2015/033570, Oct. 19, 2015, 18 pages.
"Non-Final Office Action", U.S. Appl. No. 13/721,771, May 31, 2016, 9 pages.
"Notice of Allowance", U.S. Appl. No. 13/873,557, Apr. 11, 2016, 5 pages.
"Notice of Allowance", U.S. Appl. No. 14/952,738, Mar. 28, 2016, 7 pages.
"On the need of PDCCH for SIB, RAR and Paging", 3GPP TSG-RAN WG1 #76-R1-140239, Feb. 2014, 4 pages.
"Specification Impact of Enhanced Filtering for Scalable UMTS", 3GPP TSG RAN WG1 Meeting #76, R1-140726, QUALCOMM Incorporated, Feb. 2014, 2 pages.
"Supplemental Notice of Allowance", U.S. Appl. No. 14/031,739, Apr. 21, 2016, 2 pages.
"Written Opinion", Application No. PCT/US2013/071616, Jun. 3, 2015, 9 pages.
Yu-chun,"A New Downlink Control Channel Scheme for LTE", Vehicular Technology Conference (VTC Spring), 2013 IEEE 77th, Jun. 2, 2013, 6 pages.
"Advisory Action", U.S. Appl. No. 13/692,520, Sep. 6, 2016, 3 pages.
"Corrected Notice of Allowance", U.S. Appl. No. 14/031,739, Jun. 8, 2016, 2 pages.
"Final Office Action", U.S. Appl. No. 13/733,297, Jul. 18, 2016, 17 pages.
"Final Office Action", U.S. Appl. No. 13/955,723, Jun. 16, 2016, 31 pages.
"Final Office Action", U.S. Appl. No. 14/330,317, Jun. 16, 2016, 15 pages.
"Final Office Action", U.S. Appl. No. 14/445,715, Jul. 8, 2016, 31 pages.
"Notice of Allowance", U.S. Appl. No. 14/339,476, Jul. 18, 2016, 11 pages.
"Supplemental Notice of Allowance", U.S. Appl. No. 14/952,738, Jun. 9, 2016, 4 pages.
"Corrected Notice of Allowance", U.S. Appl. No. 14/339,476, Sep. 13, 2016, 2 pages.

\* cited by examiner

APPARATUS AND METHOD FOR ANTENNA MATCHING

FIELD OF THE INVENTION

The present invention relates generally to radio communication devices, and more specifically to antenna systems used in handheld radio communication devices.

BACKGROUND

Radio communication devices typically employ antennas that optimize radio signal transmission and reception. The antennas are often coupled to the transmitter output signal and/or the receiver input signal connector though impedance matching circuits so that the transmitters and receivers can be designed and tested to a specified value. The impedance matching circuits can then be designed or adjusted for differing antennas or differing antenna environments, which vary the impedances of the antennas that may be coupled to the transmitters and/or receivers. Antenna matching circuits may have different impedance matching states that are selectable according to a radio channel and environmental conditions. In the case of handheld electronic devices, such environmental conditions include the presence of a user's hands in a variety of positions relative to an antenna or an antenna element.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments. The description is meant to be taken in conjunction with the accompanying drawings in which:

Figure 1:
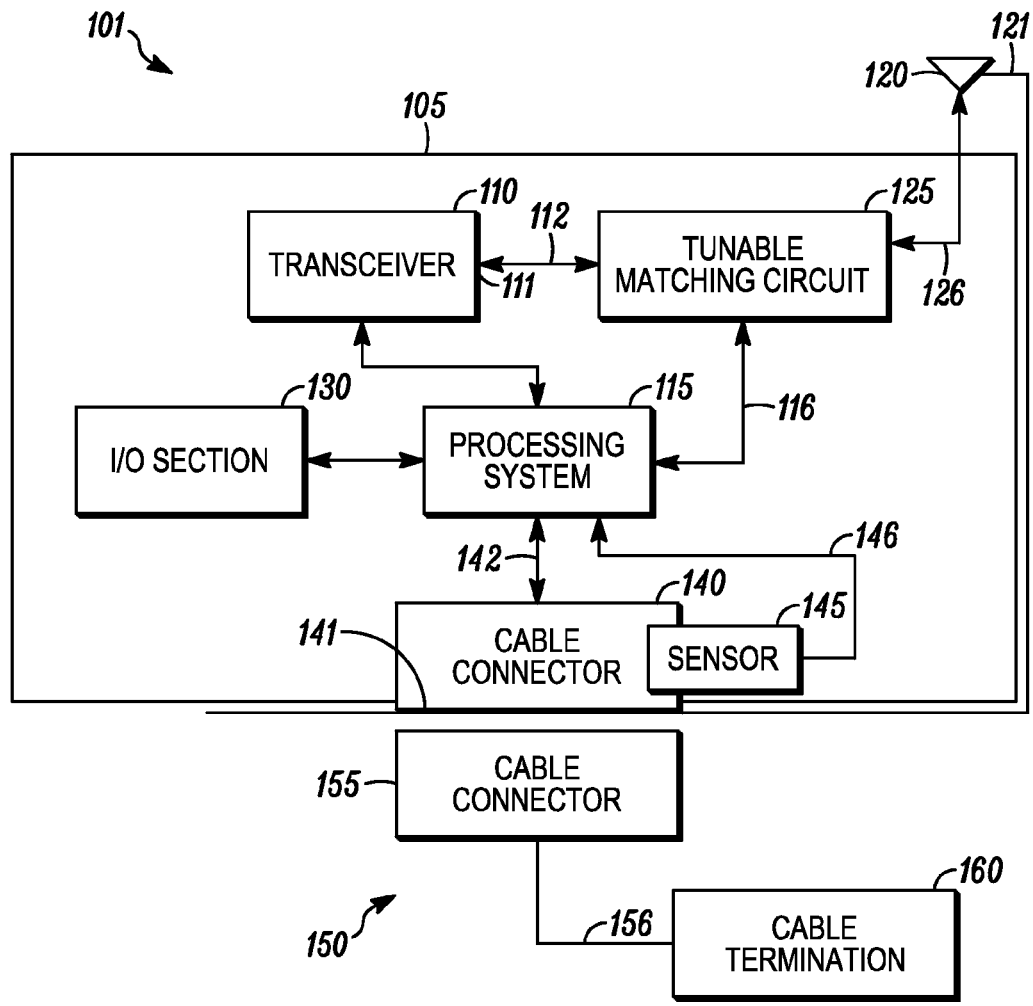
FIG. 1 is an electrical block diagram that shows a radio communication device and a cable, in accordance with certain embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of the embodiments.

DETAILED DESCRIPTION

In the description below, like reference numerals are used to describe the same, similar or corresponding parts in the several views of the drawings.

Embodiments described herein generally relate to radio communication devices that are designed with an antenna that has an element through which a cable connection is formed. One example of such a radio communication device is a cellular telephone. One example of such an antenna element is an antenna element that is positioned on the narrow dimension of the radio communication device—i.e., around part of the edge of a thin rectangular shaped radio communication device.

Referring to FIG. 1, an electrical block diagram 100 of a radio communication device 101 and a cable 150 is shown, in accordance with certain embodiments. The radio communication device 101 may be any radio communication device having at least one antenna element near to or through which a cable is connected to the radio communication device 101. Embodiments in which the antenna element has been modified to allow passage of the cable connector by removing more of the conductive material of the element typically provide more improvement. Some benefits may still be obtained for situations in which the cable connector is proximate the antenna element, and for which there is no reduction of the antenna element material proximate the cable connector. These relationships will be described in more detail with reference to FIGS. 3-5. The radio communication device 101 comprises a housing 105, a transceiver 110, a processing system 115, an antenna 120, a tunable matching circuit 125, an input/output section 130, a cable connector 140, and a sensor 145. The radio communication device 101 may be, for example, a cellular telephone, an electronic tablet, an electronic pad, a monitoring device, a vehicular communication device, just to name a few. The cable 150 comprises a compatible cable connector 155 designed to mate with cable connector 140, a cable that is designed to include wires that carry electrical signals that may be DC or AC. The AC signals may include analog or digital signals, and may include audio, video, and/or radio frequency bandwidths. Certain wires may be shielded. The cable 156 is terminated in a cable termination 160 that may be another cable connector or an electronic device.

The transceiver 110 is a radio transceiver 110. The transceiver 110 may be one of one or more transceivers in the radio communication device 101. For example, if the radio communication device 101 is cellular communication device, the radio communication device 101 may have a cellular transceiver and a Wi-Fi hotspot transceiver. The transceiver 110 represents any one transceiver when there are multiple transceivers in the radio communication device 101. The transceiver 110 may provide transmitting and receiving functions (e.g., a cellular system transmitter-receiver), or a transmitting only function (e.g., a sign-post transmitter), or a receiving only function (e.g., a global positioning system (GPS) receiver). The transceiver 110 may comprise one or more processors and associated memories for controlling the operation of the transceiver 110.

The transceiver 110 is coupled to the antenna 120. The manner in which the antenna 120 is drawn is intended to indicate that it may comprise one or more antenna elements that are outside of the housing 105, or on the housing 105, or within the housing 105, as well as an antenna signal 126 that couples the antenna elements to the tunable matching circuit 125. The antenna 120 is illustrated to show one particular antenna element 121 that is a conductive material, such as a metal alloy, disposed on the surface of the housing 105. It may be disposed by plating techniques or mechanical attachment techniques. The cable connector 140 of the radio communication device 101 has a connector insertion cavity with a face 141 that is approximately flush with the surface of the housing 105 and the antenna element 121. "Approximately flush" includes situations in which the cable connector 140 either protrudes from or is recessed from the surface of the antenna element 121. For example, the cable connector 140 may be printed circuit board mounted and/or may have a flange, resulting in a disposition of the face 141 such that it is recessed from or protrudes from the antenna element 121 by a distance that is small in comparison to the size of the antenna element 121. Although the illustration of the antenna element 121 indicates that it is disposed on three sides of the housing 105, the antenna element 121 need not be so disposed. That is, the antenna element 121 may alternatively be disposed along only part of one side of the housing and may be plated on either the inner or outer surface of the housing 105. In some embodiments the antenna element 121 may be implemented as an independent structure that is located with reference to the radio communication device 101 and the cable connector 140 such that the antenna element 121 has a hole or cutout where the cable connector 140 passes through the antenna element 121. For example, the antenna element 121 may be a bent or flat punched metal piece that is mounted to a printed circuit board inside the housing 105 of the radio communication device 101.

The tunable matching circuit 125 is coupled to the transceiver 110. When the transceiver has both a radio frequency (RF) transmitter and an RF receiver the tunable matching circuit 125 is coupled to a RF output port and an RF input port of the transceiver 110, which may be a common RF port 111. When the transceiver 110 has only one of a transmitter or receiver, the tunable matching circuit 125 is coupled to the RF port 111 that is one of an RF output port or RF input port of the transceiver 110. The RF transmitter of the transceiver 110 is designed to generate an RF signal at a selected power at a designed output impedance of the RF transmitter. The signal is coupled through the tunable matching circuit 125 to the antenna 120. The RF receiver of the transceiver 110 is designed to receive an RF signal within a designated power range at a designed input impedance of the RF receiver, wherein the RF signal is coupled from antenna 120 through the tunable matching circuit 125 to the RF input port 111.

The tunable matching circuit 125 is also coupled to the processing system 115. The tunable matching circuit 125 is a circuit that provides a selected impedance transform, or matching state, selected by control signals 116 from the processing system 115. The processing system 115 is also coupled to the sensor 145. The processing system generates the control signals 116 in response to a cable detection signal 146 generated by the sensor 145 and other parameters, such as the selected radio channel and an environmental state of the radio communication device 101. Each particular impedance transform that is selected by the control signals 116 is designed to match the impedance of the antenna 120 to the impedance of the RF port or ports 111. The impedance of the antenna may change for different states of the transceiver 110, the environment of the radio communication device 101, and the cable connection state signal. Selecting an impedance transform optimizes the transfer of signal power between the transceiver 110 and the antenna 120. The states, the environment, and the cable connection state are indicated by the control signals 116. The selected impedance transforms are mapped to the control signals 116, for example by a table stored in a memory. The action of selecting an impedance transform or matching state using the mapping function is called tuning the tunable matching circuit 125.

Each impedance transform may comprise stages of passive impedance devices, each stage able to be set to one of a plurality of gains and/or phases primarily within a narrow frequency band. The narrow frequency bands of the sets are combined to provide an impedance transform over a wide frequency band. The selection may involve the use of transistor switches. The selected impedance transform may provide an impedance at the antenna coupling which is the complex conjugate of the antenna impedance, and an impedance at the transceiver coupling which is the complex conjugate of the designed transceiver impedance, thereby maximizing the transfer of signal power between the transceiver and the antenna. Other known methods of providing a set of impedance transforms in a tunable matching circuit may alternatively be used. Advantageously, by adjusting the impedance transform one or more aspect of communication device 101 performance may be improved, such as transmitter radiated power, receiver sensitivity, communication range or distance, data rate, error rate, or energy efficiency.

Transceiver 110 is also coupled to the processing system 115. The processing system 115 is coupled to an input/output section 130, which includes human interface functions such as indicators, buttons, a graphical display, touch screen sensors as well as other sensor, such as position, orientation, and acceleration. The processing system 115 may be coupled to one or more other transceivers (not shown in FIG. 1) of the radio communication device 101 and other circuits (not shown in FIG. 1), of which just one example is a battery control circuits. There are alternative embodiments of the radio communication device 101 that relate to the configuration of the processing system 115 and the transceiver 110 and provide the same benefits. In the embodiments shown in FIG. 1, the control signals 116 that indicate the states, environment, and cable connection state are generated by processing system 115. In some embodiments the processing system 115 may be controlling the channel selection and other parameters (e.g., power output) of the transceiver 110 and the processing system 115 may also determine the environment of the radio communication device 101. Examples of the environment of the radio communication device 101 are a user's head proximity to the radio communication device 101 and a location of a user's hand holding the radio communication device 101. In these embodiments, the control signals 116 may originate in the processing system 115. In other embodiments, the transceiver 110 may have its own processing system that controls the channel selection and other parameters of the transceiver, largely based on channel control messages that are exchanged between a processing system 115 of the transceiver 110 and a fixed network radio station. These signals may be passed to the processing system 115, which generates control signals 116 from them and the cable detection signal 146.

In some embodiments the transceiver 110 has its own processing system and the signals that indicate the channel selection and other parameters of the transceiver 110 are coupled directly to the tunable matching circuit by signals 112, while the processing system 115 couples the cable connection state to the tunable matching circuit in the control signals 116. In these embodiments, the determination of the environment of the radio communication device 101 may be determined either by the processing system 115 or the processing system of the transceiver.

The mapping of the states, the environment, and the cable connection state to a particular impedance transform may be a memory based mapping function performed in the tunable matching circuit 125. Other configurations may provide the same benefits. For example, the mapping function could be done in the transceiver 110, and the transceiver 110 would then directly control the switching of the impedance stages of the tunable matching circuit 125. In this example, the cable connection state may be coupled to the transceiver 110 either directly from the sensor 145 or through the processing system 115. In some embodiments, the cable connection state may be coupled by cable detection signal 146 directly to a control circuit of the tunable matching circuit 125. The control circuit may be the mapping function. In some embodiments, the processing system 115 may be referred to as a control circuit.

As noted above, the processing system 115 is also coupled to the cable connector 140. When the cable connector 140 is mated with a cable 150 having a compatible cable connector 155, cable signals 142 may be passed between the processing system 115 and the termination of the cable 160. Also, when the cable connector 140 is mated with a cable 150 having a compatible cable connector 155, the sensor 145 changes a cable connection state that in some embodiments is coupled by cable detection signal 146 to the processing system 115. The cable connection state in this case changes from a cable absent state to a cable present state. The sensor 145 may comprise an electrical contact moved by the insertion or extraction of the compatible cable connector 155, a pull up resistor coupled to a DC voltage, and a ground, arranged in a manner known in the art. This type of sensor may be characterized as a contact switch, reflecting the fact that a moving contact is used with electronic parts and two voltage sources to cause two voltage states. Other types of switches could be used. One example is a magnetic sensor, known as a Hall effect sensor. Another example is an optical detector. The cable 150 may be, for example, a universal serial bus (USB) cable having a micro USB cable connector 155.

In some embodiments, the cable connection state is generated in response to a detection of one or more signals of the cable signals 142. The detection may be performed by the processing system 115. The sensor 145 in this case is a combination of input/output circuits of the processing system 115 that are connected to the cable signals 142, and additional logic circuits and/or execution of input/output driver instructions by the processing system 115. For example, the cable connection state may be generated by the processing system 115 in response to a sensing that +5V has occurred on a +5V circuit line in the cable signals 142. It will be appreciate that, given the physical proximity of the cable connector 140 to the antenna element 121, and particularly when the antenna element has a hole or a cutout for the cable connector 140, the presence of the compatible cable connector 155 and the wires in the cable 150 and other metallic parts of the compatible cable connector may significantly degrade the efficiency of signal coupling between the antenna element 121 and the transceiver 110 from that which existed when the compatible cable connector 155 is not present. When the compatible cable connector 155 is present, the cable connection state that indicates that the compatible cable connector 155 is present modifies the tunable matching circuit 125 to optimize the energy coupled between the antenna 120 and the transceiver 115. The transfer function that results from the modification will typically be different depending on the state of the transceiver, and therefore the transfer function, that exists when the compatible cable connector is inserted into the cable connector 140, which is determined by the control signals 116. An example of the improvement achieved by this modification is provided with reference to FIG. 7.

Figure 2:
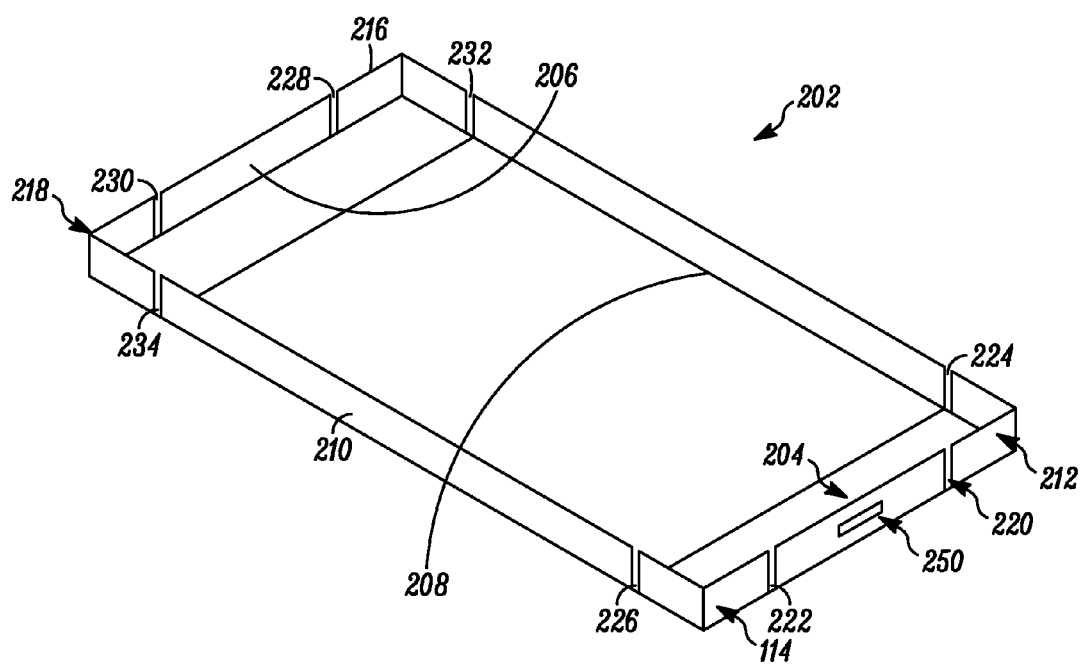
FIG. 2 is a three dimensional drawing that shows some parts of the antenna described with reference to FIG. 1, in accordance with certain embodiments.

Referring to FIG. 2, a three dimensional drawing 200 shows some parts of the antenna 120 described with reference to FIG. 1, disposed on a housing for a radio communication device such as radio communication device 101, in accordance with certain embodiments. The antenna 120 comprises a sectioned metal band 202 about a perimeter edge of the housing 105 of radio communication device 101. The inner contents of the radio communication device 101 are not specifically shown for clarity. The sectioned metal band 202 may have multiple antenna elements. In this example there are a top antenna element 206 and a bottom antenna element 204. There are two metal grounded sections, being a first grounded section 208 and a second grounded section 210. Four metal corner sections, being first, second, third and fourth corner sections (212, 214, 216, 218) are provided to reduce the capacitive coupling between the antenna elements 204, 206 and the electrical ground sections 208, 210 by providing distance between the antenna elements 204, 206 and ground. The reduction of coupling (i.e., decoupling) between the antenna elements 204, 206 and the grounded sections 208, 210 improves the antenna efficiency. The four metal sections (212, 214, 216, and 218) may be referred to as parasitic sections, electrically floating sections and/or floating sections. The four metal sections (212, 214, 216, 218) are each positioned on the sectioned metal band 202 between an antenna section and a ground section. In an alternative embodiment, the number of floating segments can be reduced from four to two by eliminating the gaps 234, 226, 232, 224.

In various embodiments, the sectioned metal band 202 comprises insulative or high impedance gaps between the various metal sections of the sectioned metal band 202. For example, the bottom antenna element 204 is defined between a first gap 220 and a second gap 222. The first corner section 212 is adjacent to and separated from a first side of the bottom antenna element 204 by the first gap 220. The first grounded section 208 is adjacent to and separated from the first corner section 212 by a third gap 224. The second corner section 214 is adjacent to and separated from a second side of the top antenna 204 by the second gap 222. The second grounded section 210 is adjacent to and separated from the second corner section 214 by a fourth gap 226.

The top antenna element 206 is positioned between a fifth gap 228 and a sixth gap 230. The third corner section 216 is adjacent to and separated from a first side of the top antenna element 206 by the fifth gap 228. The first grounded section 208 is adjacent to and separated from the third corner section 216 by a seventh gap 232. The fourth corner section 218 is adjacent to and separated from a second side of the top antenna element 206 by the sixth gap 230. The second grounded section 210 is adjacent to and separated from the fourth corner section 218 by an eighth gap 234. Thus, each metal section or element of the sectioned metal band 202 is defined and separated from each of the other metal sections by gaps. In other words, each one of the plurality of conductive metal sections and elements is interposed between the plurality of gaps such that two gaps define the ends of each conductive section or element in the slotted or sectioned metal band 102. It is understood that the gaps may be made of an insulative polymer, ceramic, plastic, epoxy, rubber, glass or other substantially equivalent insulative material, or by an absence of material.

The top and bottom antenna elements 206, 204 are both driven elements, which comprise radiating antenna elements. In some embodiments the top antenna element 206 is a diversity antenna for receiving only, while the bottom antenna element 204 is for both transmitting and receiving radio communication signals. In other embodiments, both antenna elements 204, 206 are configured to transmit or receive RF signals. In certain embodiments, antenna element 204 includes a connector hole 250, which provides for use of the cable connector 140 described with reference to FIG. 1.

The corner sections 212, 214, 216 and 218 are provided to reduce capacitive coupling between the driven top and bottom antenna elements 204, 206 and the electrical ground sections 208, 210. Since any electrical coupling between the antenna elements and the ground sections reduces the efficiency of each antenna respectively, then any improvement that reduces or helps reduce coupling or the potential for coupling between a driven antenna element and the ground sections improves the overall transceiving operation of an embodiment.

Additionally, the metal corner sections 212, 214, 216 and 218 do not function as active antenna elements. As mentioned previously, the corner sections 212, 214, 216 and 218 are provided to decrease the probability that a user's finger or hand, while holding the UE, will couple or complete a circuit between a driven antenna element, for example bottom antenna element 204, and one or more of the ground sections 208, 210. This is important because when a user's finger or hand bridges or completes the circuit between a driven antenna element and a ground section, there can be a strong capacitive coupling between the driven antenna element and ground section, thereby requiring retuning of an impedance matching circuit connected between the antenna and a transceiver.

Figure 3:
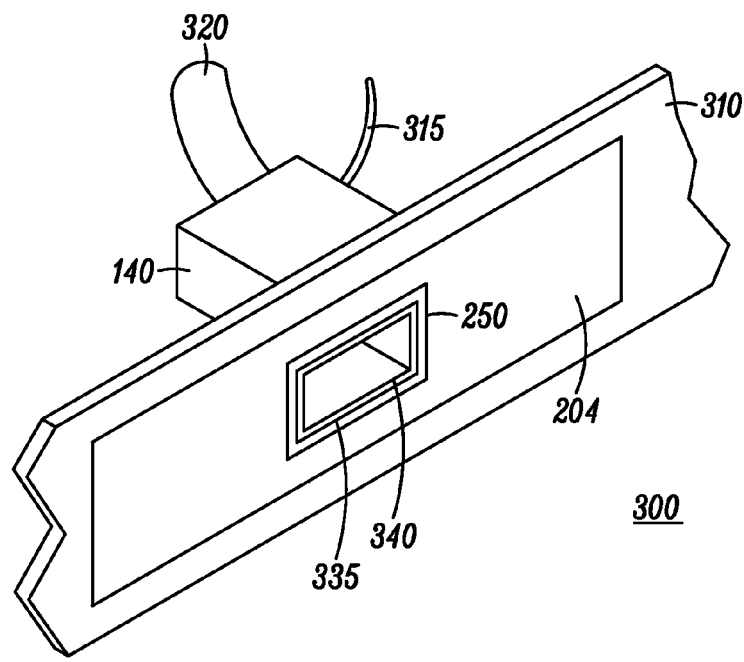
FIGS. 3-5 are three dimensional drawings, each showing a cable connector described with reference to FIG. 1 an antenna element, in accordance with certain embodiments.

Referring to FIG. 3, a three dimensional drawing 300 shows the cable connector 140 (FIG. 1) and a portion 310 of housing 105 (FIG. 1), in accordance with certain embodiments. Antenna element 204 (FIG. 2) is disposed on the portion 310 of the housing 105. A cable 320 is shown in FIG. 3, which includes wires (not shown in FIG. 3) for coupling cable signals 142 (FIG. 1) to the processing system 115 (FIG. 1). The signals may be conveyed by other means. For example, cable connector 140 could be a printed circuit board mounted connector and the cable signals 142 would then be coupled buy printed circuit board conductors. In some embodiments a separate wire 315 conveys the cable detection signal 146 to the processing system 115. In some embodiments, the separate wire 315 is not used. In the case of a printed circuit board mounted cable connector 140, the cable detection signal may alternatively be coupled by a printed circuit board conductor to the processing system 115. The antenna element 204 includes the hole 250 (FIG. 2) for a shell of the cable connector 140, which in these embodiments is shown as having shell edges 335, 340 that are flush with the antenna element 204. The outer surface of the cable connector 140, having shell edge 335, is referred in this document as the periphery of the cable connector 140. The shell edges of the cable connector 140 do not touch the antenna element 204 and are separated or isolated by a non-conductive material such as a plastic resin material for the housing. In the embodiments described with reference to FIG. 3, the periphery of the cable connector 140 is wholly within the antenna element 204. It will be appreciated that the mating of the compatible cable connector 155 with the cable connector 140 may negatively alter the impedance characteristics and radiation efficiency of the antenna element 204 and the radiation system efficiency of the antenna system comprising the antenna 120, the transceiver 110 and the tunable matching circuit 125. The use of the sensor 145 to detect the presence of the compatible cable connector 155 can trigger an adjustment of the tuning state of tunable matching circuit 125, and thereby substantially improve the radiation system efficiency of the antenna system comprising antenna 120, the transceiver 110, and tunable matching circuit 125. This improvement is achieved by adjusting the matching state of the tunable matching circuit 125 to improve the signal transfer between the transceiver 110 and antenna 120 when the antenna impedance 120 is altered due to the presence of a cable 160.

Figure 4:
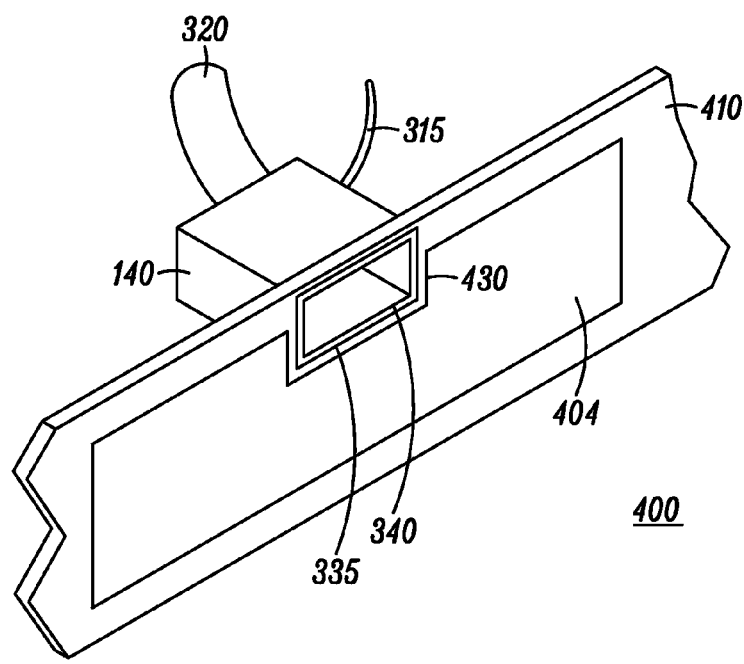

Referring to FIG. 4 a three dimensional drawing 400 shows the cable connector 140 (FIG. 1) and a portion 410 of housing 105 (FIG. 1), in accordance with certain embodiments. An antenna element 404 (FIG. 4) is disposed on the portion 410 of the housing 105 in approximately the same position as antenna element 204 (FIG. 2). The cable 320 and wire 315 and possible alternative conductors for the cable 320 and wire 315 are as described with reference to FIG. 3. The antenna element 404 includes a cutout 430 for a shell of the cable connector 140, which in these embodiments is shown as having shell edges 335, 340 that are flush with the antenna element 404. In the embodiments described with reference to FIG. 4, the periphery of the cable connector 140 is partially within the antenna element 204. It will be appreciated that the mating of the compatible cable connector 155 with the cable connector 140 may negatively alter the impedance characteristics and radiation efficiency of the antenna element 404 and the radiation system efficiency of the system comprising the antenna 120, the transceiver 110 and the tunable matching circuit 125. The use of the sensor 145 to detect the presence of the compatible cable connector 155 can trigger an adjustment of the tuning state of tunable matching circuit 125, and thereby substantially improve the radiation system efficiency of the antenna system comprising antenna 120 and tunable matching circuit 125.

Figure 5:
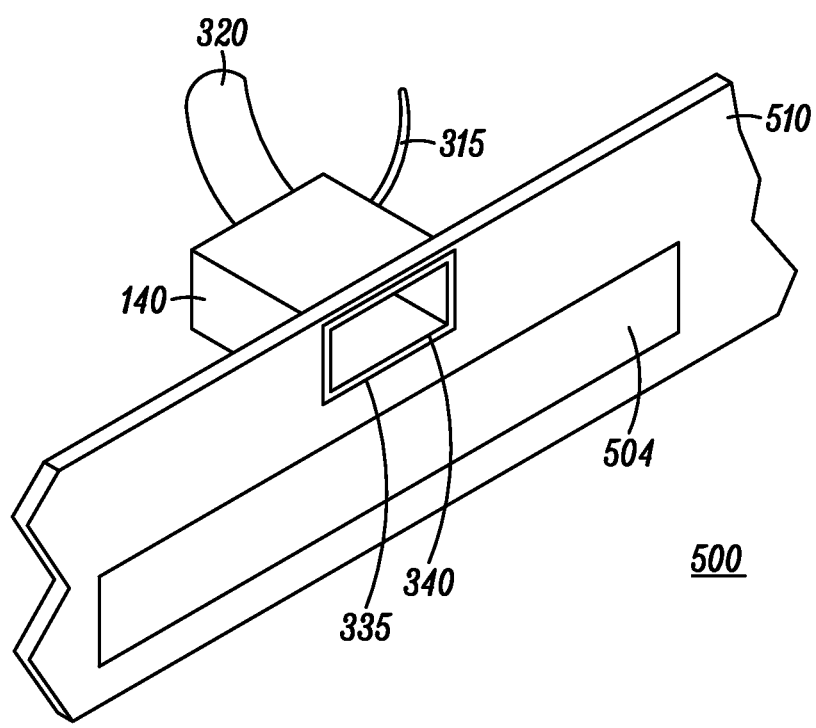

Referring to FIG. 5 a three dimensional drawing 500 shows the cable connector 140 (FIG. 1) and a portion 510 of housing 105 (FIG. 1), in accordance with certain embodiments. An antenna element 504 (FIG. 5) is disposed on the portion 510 of the housing 105 in approximately the same position as antenna element 204 (FIG. 2). The cable 320 and wire 315 and possible alternatives for the cable 320 and wire 315 are as described with reference to FIG. 3. The antenna element 504 is proximate the shell of the cable connector 140, which in these embodiments is shown as having shell edges 335, 340 that are flush with the housing 510. In the embodiments described with reference to FIG. 5, the periphery of the cable connector 140 is described as being proximate or adjacent to the antenna element 504. It will be appreciated that the mating of the compatible cable connector 155 with the cable connector 140 may negatively alter the impedance characteristics and radiation efficiency of the antenna element 504 and the radiation system efficiency of the system comprising the antenna 120, the transceiver 110 and the tunable matching circuit 125. The use of the sensor 145 to detect the presence of the compatible cable connector 155 can trigger an adjustment of the tuning state of tunable matching circuit 125, and thereby improve the radiation system efficiency of the antenna system comprising the antenna 120, the transceiver 110 and the tunable matching circuit 125.

Figure 6:
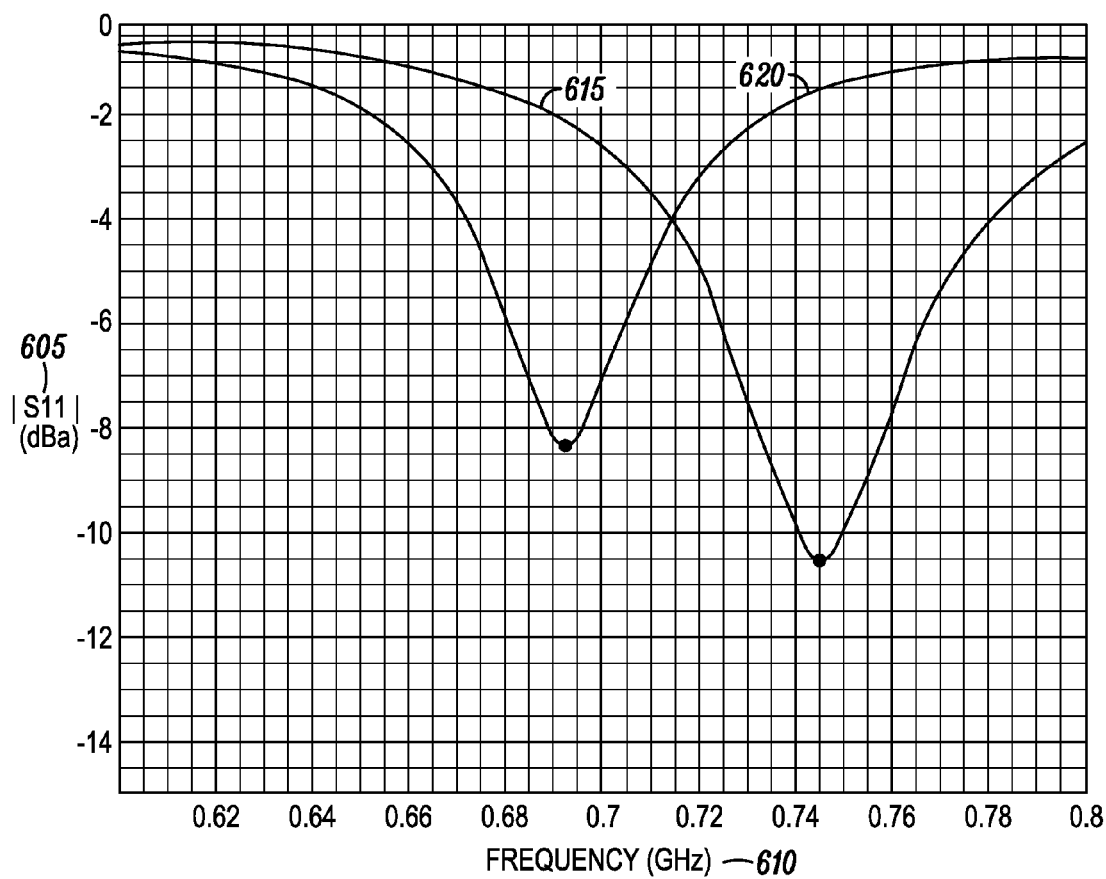
FIG. 6 is a graph that shows plots of antenna return loss for a particular radio communication device in the presence and absence of a particular cable.

Referring to FIG. 6, a graph 600 shows plots of antenna return loss for a particular radio communication device in the presence and absence of a particular cable. The particular radio communication device is a specific model of a cellular telephone, with its associated cellular antenna. The cellular antenna is similar to antenna 120 described with reference to FIGS. 1-3 that is disposed on a housing of the cellular telephone that is similar to that described with reference to FIG. 1. The particular cable connector is a micro USB cable connector of a selected USB cable that is compatible with the USB cable connector of the particular cellular telephone model. The vertical axis 605 of the graph 600 shows return loss in dB. The horizontal axis 610 of the graph 600 shows frequency in GHz. The antenna return loss is plotted for frequencies from 0.6 GHz to 0.8 GHz, which is a frequency range that includes the transceiver operating frequencies. In this frequency range the antenna return loss is affected by the absence and presence of a micro USB connector that is positioned relative to the antenna element in the manner described with reference to FIGS. 2-3. The tunable matching circuit setting is selected for a test environment and for no USB cable connector being inserted in the female USB connector that is a permanent part of the cellular radio. Plot 615 shows the return loss without the USB cable connector being inserted in the female USB connector. Plot 620 shows the return loss with the USB cable connector being inserted in the female USB connector. It can be seen that the resonant frequency of the antennas shifts approximately 53 MHz and the return loss at the resonant frequency of about 745 MHz degrades by about 9 dB. If the benefits of embodiments are not used, this degradation causes a substantial loss of system efficiency, as described below.

Figure 7:
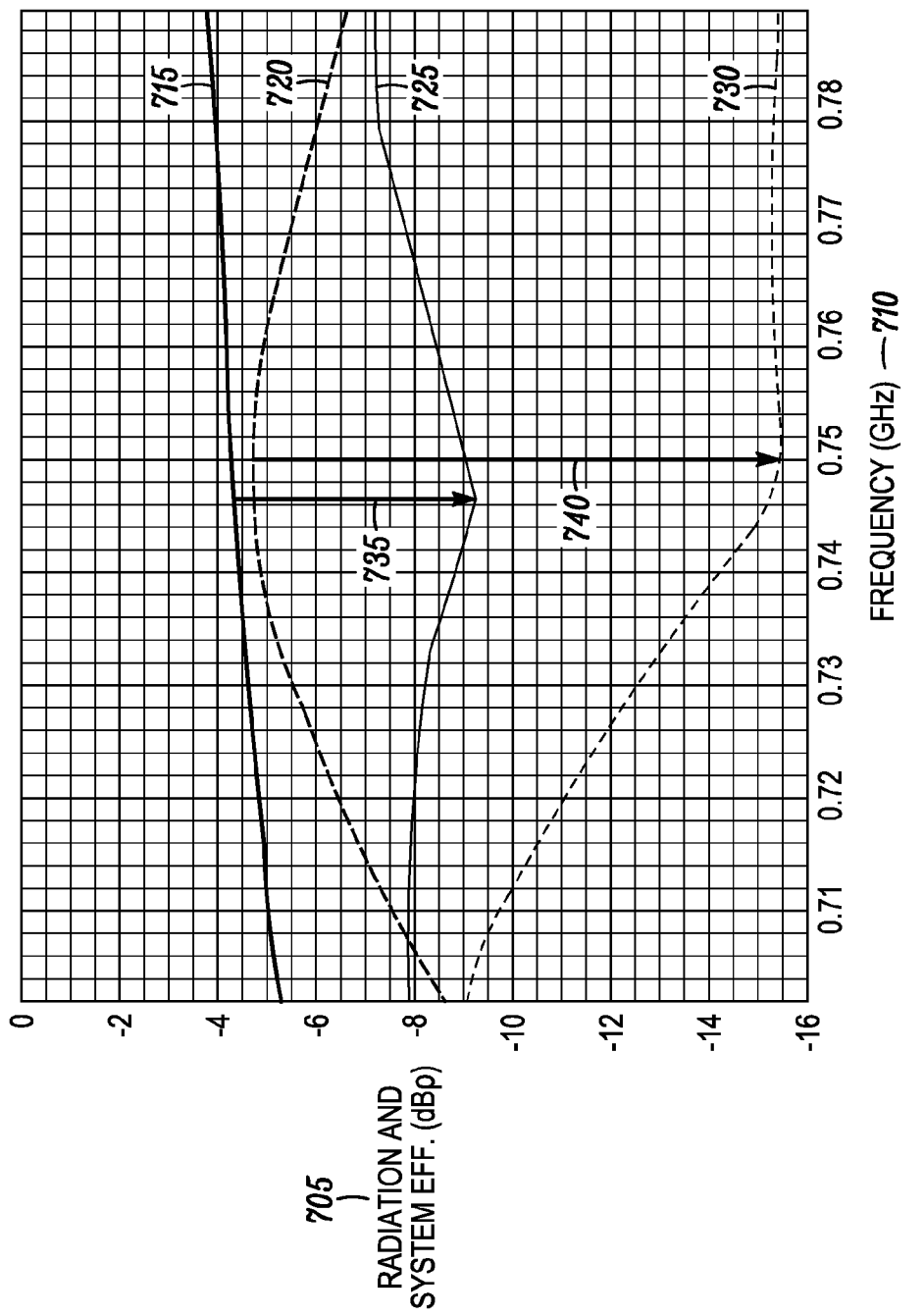
FIG. 7 is a graph that shows plots of radiation efficiencies and system efficiencies for different situations of the cellular telephone and the presence and absence of a USB cable, in accordance with certain embodiments.

Referring to FIG. 7, a graph 700 shows plots of radiation efficiencies and system efficiencies for different situations of the cellular telephone and the presence and absence of the USB cable described above with reference to FIG. 3 and FIG. 6, in accordance with certain embodiments. The vertical axis 705 shows the values of radiation and system efficiencies with reference to a maximum of 0 dB (zero decibels of power) over a range of frequencies of interest, in GHz, for the cellular telephone, for the presence or absence of the USB cable connector, and for particular settings of the tunable matching circuit of the particular radio communication device. The horizontal axis 710 shows frequency in GHz. Antenna efficiency is defined as the power radiated from the particular antenna divided by the power delivered to the antenna, e.g., the power of the antenna signal 126 that is delivered into antenna 120 and not reflected back into matching circuit 125 (FIG. 1). System efficiency is defined as the power radiated from the particular antenna divided by the power available from the source e.g., the power of the antenna signal 126 that would be delivered into antenna 120 if the antenna impedance were the complex conjugate of the matching circuit 125 output impedance (FIG. 1).

Plot 715 shows the radiation efficiency for the cellular antenna without the USB cable connector being present, and with the tunable circuit setting that has been selected for initial testing. Plot 720 shows the system efficiency under the same circumstances.

Plots 725 and 730 show, respectively, the radiation efficiency and system efficiency when the USB cable connector is present under the same circumstances. It can be seen that the antenna efficiency degrades by approximately 5 dB at the center frequency, shown by arrow 735, and that the system efficiency degrades by approximately 11 dB at the center frequency, shown by arrow 740.

By modifying the tunable matching circuit settings to minimize the antenna impedance mismatch, as described above, the degradation of the system efficiency can be substantially improved. In simulation of a cellular telephone in which the impedance transform of tunable matching circuit was selected for a transmit band of 0.704-0.716 GHz in a test environment, improvements across the transmit band of up to 5 dB of system efficiency were achieved by selecting the setting of the tunable matching circuit to optimize the antenna matching for the situations when the USB connector was present and not present.

It will be appreciated that the positioning and dimensions of the antenna element and the cable connector will affect the degradation caused by the insertion of the compatible cable connector, and therefore affect the amount of improvement that can be achieved by changing the setting of the tunable matching circuit. For different embodiments in which the antenna section is the same width and length, a same cable connector that is positioned in the cutout situation shown in FIG. 4 (such that less of the antenna section is removed) will have less degradation, and thus less improvement than for the situation described with reference to FIG. 3. For the situation shown in FIG. 5, and if the antenna section 504 were the same width as the antenna section 204 (FIG. 3), the degradation and improvement are predicted to be even less than for the cutout situation described with reference to FIG. 4. The embodiments can provide substantial improvements for these situations in which the cable connector periphery is disposed in a cutout of the antenna element or is disposed proximate the antenna element, in some cases providing more than 5 dB of system efficiency improvement.

Figure 8:
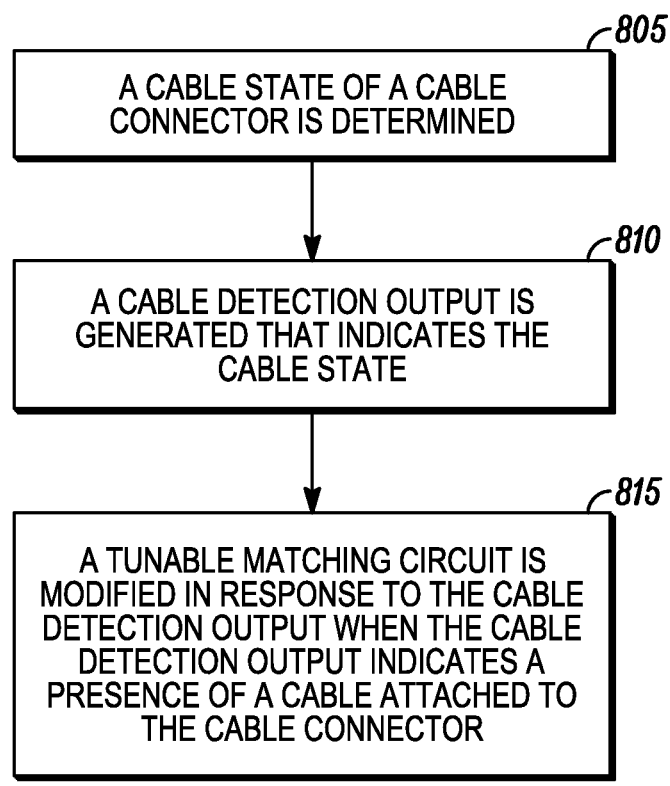
FIG. 8 is a flow chart that shows some steps of a method for tuning a tunable matching circuit, in accordance with certain embodiments.

Referring to FIG. 8, a flow chart 800 shows some steps of a method for tuning a tunable matching circuit, in accordance with certain embodiments. At step 805, a cable connection state of a cable connector is determined. At step 810, a cable detection signal is generated that indicates the cable connection state. At step 815 an impedance transform of a tunable matching circuit is modified in response to the cable detection signal. The cable detection signal indicates one of a presence and an absence of a cable attached to the cable connector. The tunable matching circuit couples the modified impedance transform between a transceiver and an antenna. A periphery of the cable connector is disposed at least partially within an antenna element of the antenna. A first system efficiency that exists while the tunable matching circuit is modified for the presence of the cable and the cable is connected provides a substantial increase above a second system efficiency that exists while the tunable matching circuit is not modified for the presence of the cable and the cable is connected. A substantial increase in this context means at least 2 dB.

In accordance with the above descriptions, some embodiments may be described as an apparatus including a transceiver 110, an antenna 120, a tunable matching circuit 125, a cable connector 140, a sensor 145, and a control circuit. The tunable matching circuit 125 is responsive to a tuning input to modify an impedance transform of the tunable matching circuit 125. The tunable matching circuit 125 couples the selected impedance transform between the transceiver 110 and the antenna 120. The sensor 145 determines a cable connection state of the cable connector 140 and generates a cable detection signal that indicates the cable connection state. The control circuit is coupled to the cable detection signal and the tuning input of the matching circuit. The control circuit modifies the tunable matching circuit in response to an indication of the cable connection state that a cable 150 is present in the connector. In some embodiments, the control circuit may physically be integrated with the tunable matching circuit 125. In other embodiments, the control circuit may be a portion of a processing system 115. A first system efficiency that exists while the tunable matching circuit 125 is modified for the presence of the cable 150 and the cable 150 is connected (by cable connector 155 to cable connector 140) provides a substantial increase above a second system efficiency that exists while the cable detection signal is uncoupled from the control circuit and the tunable matching circuit 125 is not modified for the presence of the cable 150 and the cable 150 is connected (by cable connector 155 to cable connector 140).

In accordance with the above descriptions, some embodiments may be described as an apparatus that includes a transceiver 110, an antenna 120, a tunable matching circuit 125, a cable connector 140, and a processing system 115. The tunable matching circuit 125 is responsive to a tuning input to select an impedance transform of the tunable matching circuit 125. The tunable matching circuit 125 couples the selected impedance transform between the transceiver 110 and the antenna 120. The sensor 145 determines a cable connection state of the cable connector 140. The cable connection state is one of present and absent. The sensor 145 generates a cable detection signal 146 that indicates the cable connection state. The processing system 115 is coupled to the cable detection signal and the tuning input of the tunable matching circuit 125. The processing system 115 tunes the tunable matching circuit 125 in response to the cable connection state. A first impedance transform is selected when the cable connection state is present and a second impedance transform is selected when the cable connection state is absent. A first system efficiency that exists while a cable connection state of present is coupled to the tuning input and a cable 150 is connected (by cable connector 155 to cable connector 140) provides a substantial increase above a second system efficiency that exists while the coupling of the cable detection signal from the sensor to the processing system is removed and a cable connection state of absent is coupled to the tuning input and the cable 150 is connected (by cable connector 155 to cable connector 140).

It should be apparent to those of ordinary skill in the art that for the methods described herein other steps may be added or existing steps may be removed, modified or rearranged without departing from the scope of the methods. Also, the methods are described with respect to the apparatuses described herein by way of example and not limitation, and the methods may be used in other systems.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element. The term "coupled" as used herein is defined as connected, although not necessarily directly and not necessarily mechanically.

Reference throughout this document are made to "one embodiment", "certain embodiments", "an embodiment" or similar terms The appearances of such phrases or in various places throughout this specification are not necessarily all referring to the same embodiment. Furthermore, the particular features, structures, or characteristics attributed to any of the embodiments referred to herein may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

The processes illustrated in this document, for example (but not limited to) the method steps described in FIG. 8, may be performed using programmed instructions contained on a computer readable medium which may be read by a processor of a CPU. A computer readable medium may be any tangible medium capable of storing instructions to be performed by a microprocessor. The medium may be one of or include one or more of a CD disc, DVD disc, magnetic or optical disc, tape, and semiconductor based removable or non-removable memory. The programming instructions may also be carried in the intangible form of packetized or non-packetized wire line or wireless transmission signals.

In the foregoing specification, specific embodiments have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. An apparatus, comprising:
    a transceiver having a transceiver impedance;
    an antenna having an antenna impedance and a cable connector element through which a cable connection is formable, the cable connector element having a location that degrades an effectiveness of an impedance transform for matching the antenna impedance with the transceiver impedance when the cable connection is formed by a cable connected to the cable connector element;
    a tunable matching circuit for coupling the impedance transform between the transceiver and the antenna;
    a sensor that determines a cable connection state of the cable connector element and generates a cable detection signal that indicates the cable connection state; and
    a control circuit coupled to the cable detection signal and a tuning input of the tunable matching circuit, the control circuit configured to:
        modify, via the tuning input and in response to an indication of the cable connection state indicating that the cable is connected to the cable connector element, the impedance transform used by the tunable matching circuit to match the antenna impedance with the transceiver impedance; and
        cause, via the modifying, a first system efficiency while the tunable matching circuit is modified for the presence of the cable and the cable is connected, the first system efficiency providing a substantial increase above a second system efficiency that exists while the effectiveness of the impedance transform is degraded when a cable is connected to the cable connector.

2. The apparatus according to claim 1, wherein the antenna comprises an antenna element and wherein a periphery of the cable connector element is at least partially within the antenna element.

3. The apparatus according to claim 1, wherein the tunable matching circuit has a frequency range and the substantial increase is an improvement of at least 5 dB for at least one frequency in the frequency range.

4. The apparatus according to claim 3, wherein the frequency range includes a frequency range within frequency limits 0.60 GHz and 0.80 GHz.

5. The apparatus according to claim 1, wherein the sensor uses one of a contact switch and a magnetic switch.

6. The apparatus according to claim 1, wherein the apparatus is a handheld cellular communication device.

7. The apparatus according to claim 1, wherein the modification of the impedance transform used by the tunable matching circuit is achieved by switching passive electronic components that are coupled between the transceiver and the antenna.

8. An apparatus, comprising:
a transceiver having a transceiver impedance;
an antenna having an antenna impedance and a cable connector element through which a cable connection is formable, the cable connector element having a location on the apparatus that affects the antenna impedance when the cable connection is formed by a cable connected to the cable connector element;
a tunable matching circuit;
a sensor that determines a cable connection state of the cable connector element, the cable connection state being one of present and absent, and generates a cable detection signal that indicates the cable connection state; and
a processing system coupled to the cable detection signal and a tuning input of the tunable matching circuit, the processing system configured to:
tune, via the tuning input, the tunable matching circuit in response to the cable connection state indicating that the cable is connected to the cable connector element, the tuning causing the tunable matching circuit to select a first impedance transform and couple the selected first impedance transform between the transceiver and the antenna; and
generate, while the cable is connected, a first system efficiency, the first system efficiency providing a substantial increase above a second system efficiency, the second system efficiency existing while the cable is connected and while no cable detection signal is coupled to the processing system; or
tune the tunable matching circuit in response to the cable connection state being the state of absent, the tuning causing the tunable matching circuit to select a second impedance transform that causes the transceiver impedance to match the antenna impedance while the cable is not connected.

9. The apparatus according to claim 8, wherein the antenna comprises an antenna element and wherein a periphery of the cable connector element is at least partially within the antenna element.

10. The apparatus according to claim 8, wherein the tunable matching circuit has a frequency range and the substantial increase is an improvement of at least 5 dB for at least one frequency in the frequency range.

11. The apparatus according to claim 10, wherein the frequency range includes a frequency range within frequency limits 0.60 GHz and 0.80 GHz.

12. The apparatus according to claim 8, wherein the sensor uses one of a contact switch and a magnetic switch.

13. The apparatus according to claim 8, wherein the apparatus is a handheld cellular communication device.

14. The apparatus according to claim 8, wherein tuning the tunable matching circuit in response to the cable connection state is achieved by switching passive electrical components coupled between the transceiver and the antenna.

15. A method, comprising:
determining a cable connection state of a cable connector element of an antenna through which a cable connection is formable, the cable connector element degrading an effectiveness of an impedance transform of a tunable matching circuit when the cable connection is formed by a cable connected to the cable connector element;
generating a cable detection signal that indicates the cable connection state; and
modifying the impedance transform of the tunable matching circuit in response to the cable detection signal indicating a presence of the cable, the tunable matching circuit coupling the modified impedance transform between a transceiver and the antenna, the modifying causing a first system efficiency while the tunable matching circuit is modified for the presence of the cable and the cable is connected, the first system efficiency providing a substantial increase above a second system efficiency that exists while the effectiveness of the impedance transform is degraded when the cable is connected to the cable connector.

16. The method according to claim 15, wherein the antenna comprises an antenna element and wherein a periphery of the cable connector element is disposed at least partially within the antenna element.

17. The method according to claim 15, wherein the tunable matching circuit has a frequency range and the substantial increase is an improvement of at least 5 dB for at least one frequency in the frequency range.

18. The method according to claim 17, wherein the frequency range includes a frequency range within frequency limits 0.60 GHz and 0.80 GHz.

19. The method according to claim 15, wherein the cable connection state is determined by one of a contact switch and a magnetic switch.

20. The method according to claim 15, wherein the modifying of the impedance transform of the tunable matching circuit is achieved by switching passive electrical components coupled between the transceiver and the antenna.

* * * * *